US010490512B2

(12) United States Patent
Kitazaki et al.

(10) Patent No.: US 10,490,512 B2
(45) Date of Patent: Nov. 26, 2019

(54) METHOD OF MAKING PLURAL ELECTRONIC COMPONENT MODULES

(71) Applicant: TAIYO YUDEN CO., LTD., Tokyo (JP)

(72) Inventors: Kenzo Kitazaki, Tokyo (JP); Takehiko Kai, Tokyo (JP); Masaya Shimamura, Tokyo (JP); Mikio Aoki, Tokyo (JP); Jin Mikata, Tokyo (JP); Taiji Ito, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/380,990

(22) Filed: Apr. 10, 2019

(65) Prior Publication Data
US 2019/0237409 A1 Aug. 1, 2019

Related U.S. Application Data

(62) Division of application No. 15/934,829, filed on Mar. 23, 2018, now abandoned.

(30) Foreign Application Priority Data

Mar. 30, 2017 (JP) .................................. 2017-067050

(51) Int. Cl.
H01L 23/28 (2006.01)
H01L 23/552 (2006.01)
(Continued)

(52) U.S. Cl.
CPC ............ H01L 23/552 (2013.01); H01L 23/02 (2013.01); H01L 23/28 (2013.01);
(Continued)

(58) Field of Classification Search
None
See application file for complete search history.

(56) References Cited

U.S. PATENT DOCUMENTS 5,517,515 A      5/1996 Spall et al.
6,285,079 B1 *   9/2001 Kunikiyo ............ H01L 23/3114
                                                  257/737
(Continued)

FOREIGN PATENT DOCUMENTS

JP    2009-218484 A    9/2009
JP    2013-058513 A    3/2013
(Continued)

OTHER PUBLICATIONS

Japanese Office Action dated Sep. 11, 2018, in a counterpart Japanese patent application No. 2017-067067.
(Continued)

Primary Examiner — Bilkis Jahan
(74) Attorney, Agent, or Firm — Chen Yoshimura LLP

(57) ABSTRACT

A method of manufacturing a plurality of identical electronic component modules includes: preparing an assembly substrate that includes a plurality of electronic components mounted thereon; digging a first groove along the dicing lines from a top surface of a sealing member that seals each electronic component, the first groove penetrating the sealing member and reaching an intermediate depth within a base substrate; widening an upper portion of the first grove to define a second groove that is continuous with the lower portion of the first groove; forming a shielding film by depositing a film made of a conductive material on the top surface of the sealing member and on inner walls of the first and second grooves that include the sidewalls of the sealing (Continued)

member; and thereafter, cutting the base substrate at a bottom of the lower portion of the first groove along dicing lines.

4 Claims, 20 Drawing Sheets

(51) Int. Cl.
*H01L 23/02* (2006.01)
*H01L 23/31* (2006.01)
*H01L 25/10* (2006.01)
*H01L 21/56* (2006.01)

(52) U.S. Cl.
CPC ........ *H01L 23/3121* (2013.01); *H01L 25/105* (2013.01); *H01L 21/561* (2013.01); *H01L 2224/16225* (2013.01); *H01L 2224/97* (2013.01); *H01L 2924/1815* (2013.01)

(56) References Cited

U.S. PATENT DOCUMENTS

| | | | | |
|---|---|---|---|---|
| 2004/0238934 A1* | 12/2004 | Warner | .................... | H01L 23/24 |
| | | | | 257/686 |
| 2005/0280139 A1* | 12/2005 | Zhao | ....................... | H01L 23/24 |
| | | | | 257/704 |
| 2006/0249824 A1* | 11/2006 | Lee | .......................... | H01L 24/97 |
| | | | | 257/678 |
| 2008/0111225 A1* | 5/2008 | Kim | ..................... | H01L 25/0657 |
| | | | | 257/686 |
| 2009/0212401 A1* | 8/2009 | Do | ........................ | H01L 21/56 |
| | | | | 257/659 |
| 2009/0302439 A1* | 12/2009 | Pagaila | ................... | H01L 23/29 |
| | | | | 257/660 |
| 2011/0304015 A1* | 12/2011 | Kim | ...................... | H01L 23/552 |
| | | | | 257/532 |
| 2012/0015687 A1 | 1/2012 | Yamada et al. | | |
| 2015/0016066 A1* | 1/2015 | Shimamura | ......... | H01L 23/3121 |
| | | | | 361/728 |
| 2015/0171019 A1 | 6/2015 | Otsubo et al. | | |
| 2015/0171060 A1 | 6/2015 | Goto et al. | | |
| 2016/0149300 A1 | 5/2016 | Ito et al. | | |
| 2017/0323838 A1 | 11/2017 | Otsubo et al. | | |
| 2018/0199428 A1 | 7/2018 | Otsubo et al. | | |
| 2018/0286796 A1 | 10/2018 | Kitazaki et al. | | |

FOREIGN PATENT DOCUMENTS

| | | |
|---|---|---|
| JP | 2014-146624 A | 8/2014 |
| JP | 2015-115552 A | 6/2015 |
| JP | 2015-115560 A | 6/2015 |
| JP | 2015-233164 A | 12/2015 |
| JP | 2018-170421 A | 11/2018 |
| WO | 2010/103756 A1 | 9/2010 |
| WO | 2015/015863 A1 | 2/2015 |
| WO | 2016/121491 A1 | 8/2016 |
| WO | 2017/043621 A1 | 3/2017 |

OTHER PUBLICATIONS

U.S. Appl. No. 15/934,757, filed Mar. 23, 2018.
Japanese Office Action dated Sep. 4, 2018, in a counterpart Japanese patent application No. 2017-067050.

* cited by examiner

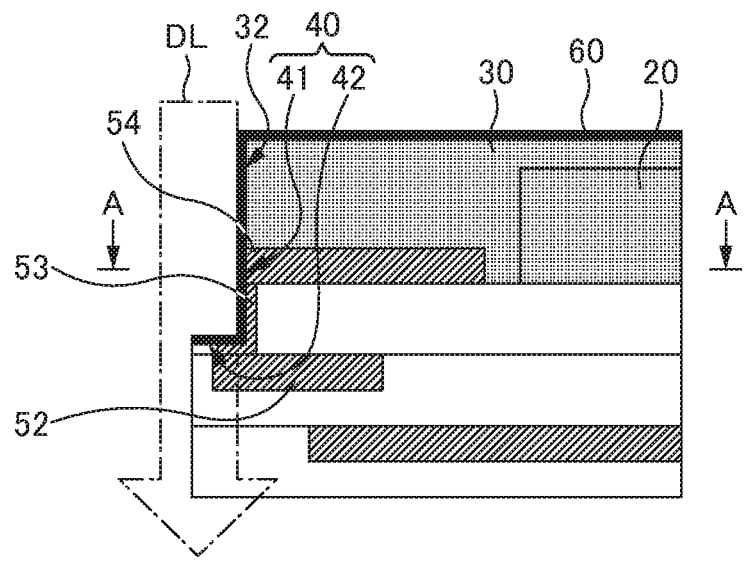
FIG. 3A SCHEMATIC VIEW
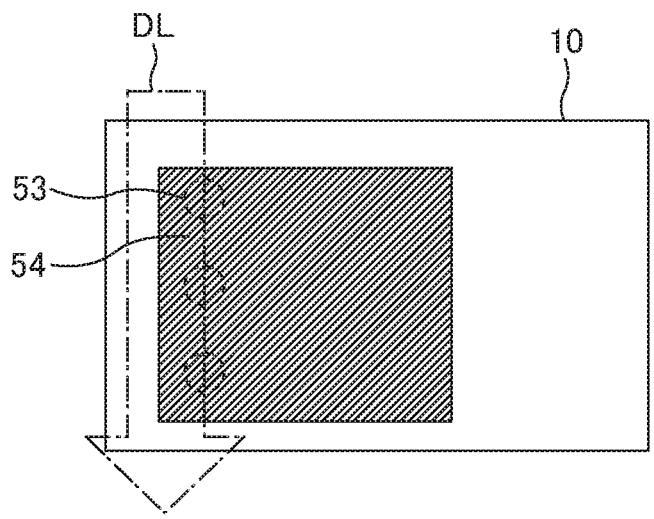
FIG. 3B END VIEW ALONG LINE A-A

METHOD OF MAKING PLURAL ELECTRONIC COMPONENT MODULES

CROSS-REFERENCE TO RELATED APPLICATION

This application is a divisional of a pending application, application Ser. No. 15/934,829 filed on Mar. 23, 2018, which is hereby incorporated by reference in its entirety. The parent application claims the benefit of priority to Japanese Patent Application No. 2017-67050, filed Mar. 30, 2017, of which full contents are incorporated herein by reference.

BACKGROUND OF THE INVENTION

Technical Field

The present disclosure relates to method of making plural electronic component modules.

Background Art

A semiconductor package is known in which an electromagnetic shield is formed on a surface thereof so as to suppress Electro Magnetic Interference (EMI) generated from a semiconductor device. In manufacturing this type of semiconductor devices, for example, a plurality of semiconductor packages obtained by singulation from an assembly substrate is arranged and fixed at predetermined intervals on a carrier, and then a shielding film is formed by a film forming means such as sputtering.

However, it takes time and efforts to arrange and fix such singulated semiconductor packages on the carrier. In addition, since the semiconductor packages are arranged at predetermined intervals on the carrier, productivity is reduced. Furthermore, depending on film forming means, a film forming material goes around to the back surface of the semiconductor package, which causes deterioration in quality. Further, when singulation is performed by a dicing apparatus, the area of a ground electrode exposed on the side surface of a substrate is limited, which results in increase in contact resistance.

Accordingly, an aspect of the present disclosure is to provide an electronic component module capable of forming a shielding film in a state of an assembly substrate and enhancing productivity.

SUMMARY OF THE INVENTION

A method of manufacturing a plurality of identical electronic component in one aspect of the present invention modules includes: preparing an assembly substrate in which, in a plan view, a plurality of unit regions are defined in a matrix, boundaries between the unit regions defining dicing lines in a lattice pattern in the plan view along which the assembly substrate will be diced into the plurality of identical electronic component modules, the assembly substrate including: a base substrate; an electronic component mounted in each of the plurality of unit regions on the base substrate; an electrode pattern in each of the plurality of unit regions within the base substrate; and a sealing member made of an insulating material covering an entire surface of the base substrate including the electronic components respectively mounted in the plurality of unit regions; digging a first groove along the dicing lines from a top surface of the sealing member, the first groove penetrating the sealing member and reaching an intermediate depth within the base substrate, a lower portion of the first groove defining and exposing a side face of the base substrate and a side face of the electrode pattern in each of the plurality of unit regions; widening an upper portion of the first grove to define a second groove that is continuous with the lower portion of the first groove, the second groove thereby starting from the top surface of the sealing member and having a width larger than and a depth shallower than the first groove, the lower portion of the first grove and the second grove defining step-shaped sidewalls of the sealing members in each of the plurality of unit regions; forming a shielding film by depositing, in a low-pressure atmosphere having a pressure lower than an atmospheric pressure, a film made of a conductive material on the top surface of the sealing member and on inner walls of the first and second grooves that include the sidewalls of the sealing member, the second groove providing a pathway for the conductive material to reach the inner walls of the first groove, the shielding film thereby covering the top surface of the sealing member and the inner walls of the first and second grooves and being in contact with the exposed side face of the electrode pattern in each of the plurality of unit regions; and thereafter, separating the assembly substrate into the plurality of identical electronic component modules by cutting the base substrate at a bottom of the lower portion of the first groove along the dicing lines.

BRIEF DESCRIPTION OF THE DRAWINGS

FIG. 3A is a schematic diagram illustrating an electronic component module according to a first embodiment where a solid ground is used.

FIG. 3B is a schematic diagram illustrating an electronic component module according to a first embodiment where a solid ground is used.

DETAILED DESCRIPTION

Figure 1:
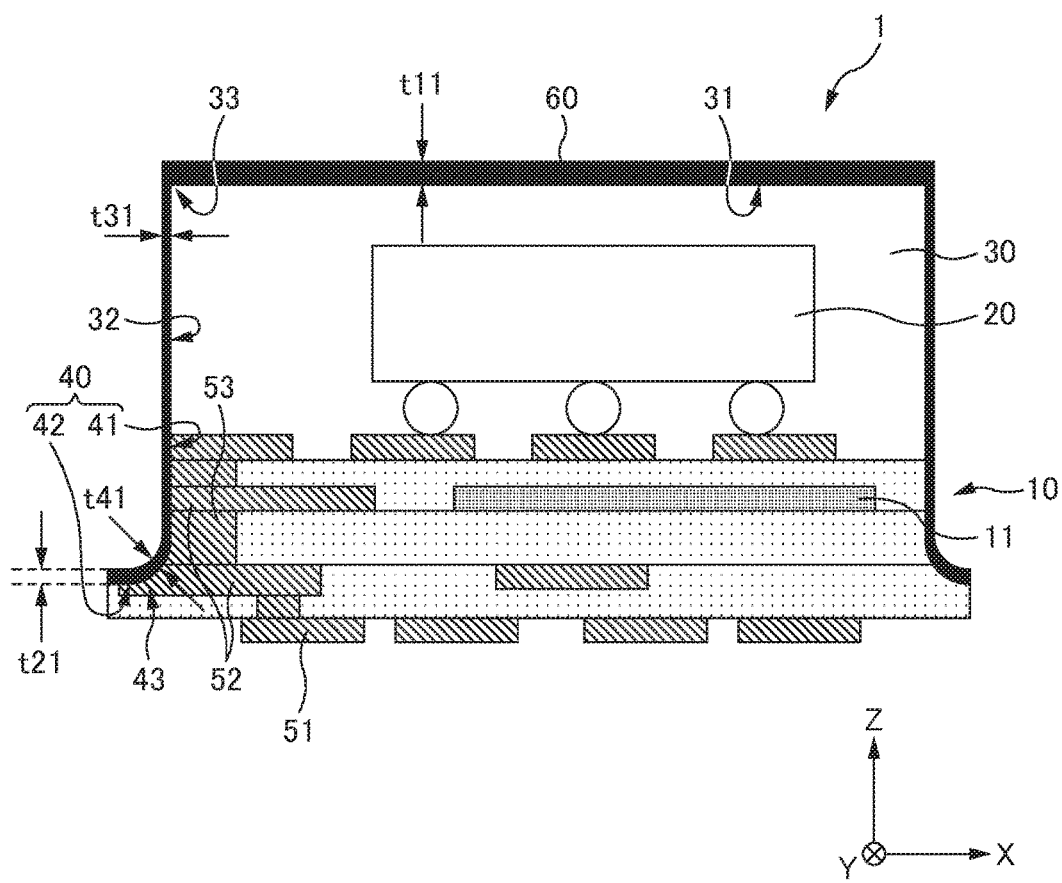
FIG. 1 is a schematic diagram illustrating an electronic component module according to a first embodiment.

Hereinafter, various embodiments of the present disclosure will be described with reference to drawings as appropriate. In the drawings, common or similar components are given the same or similar reference numerals.

A description will be given, hereinafter, using the following coordinate axes for convenience sake. That is, the positive direction of a Z-axis is set to be a vertically upward direction. The positive direction of a Y-axis is set to be orthogonal to the Z-axis as well as a direction from the front to the rear in the drawings. The X-axis is set to be a direction orthogonal to the Y-axis and Z-axis. Thus, the upper side and the lower side mean the positive side and the negative side of the Z-axis, respectively, while the right side and the left side mean the positive side and the negative side of the X-axis, respectively.

First Embodiment

==Configuration of Electronic Component Module 1==

Figure 2A:
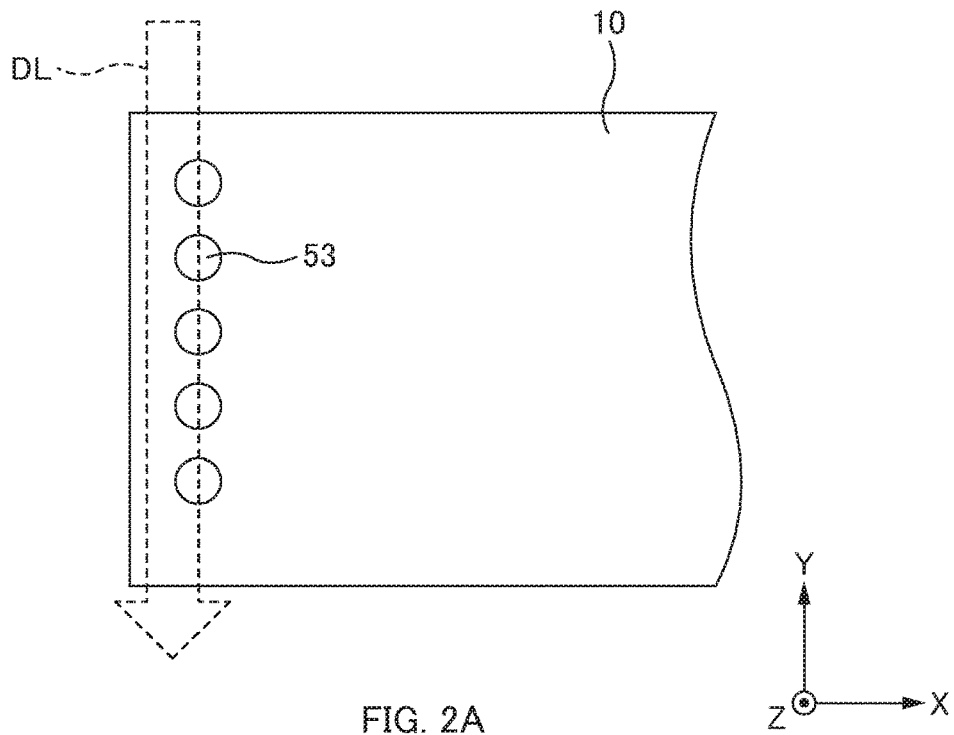
FIG. 2A is a diagram illustrating a positional relationship of vias (or through holes) formed inside an electronic component module of FIG. 1 when viewed from an upper surface side.
Figure 2B:
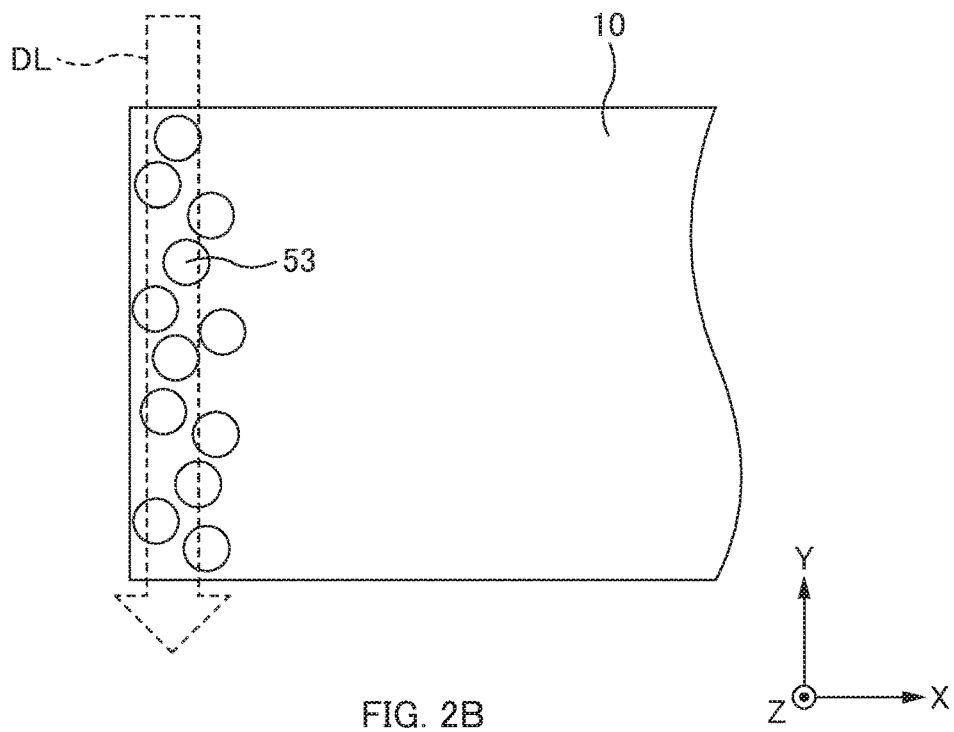
FIG. 2B is a diagram illustrating a positional relationship of vias (or through holes) formed inside an electronic component module of FIG. 1 when viewed from an upper surface side.
Figure 4A:
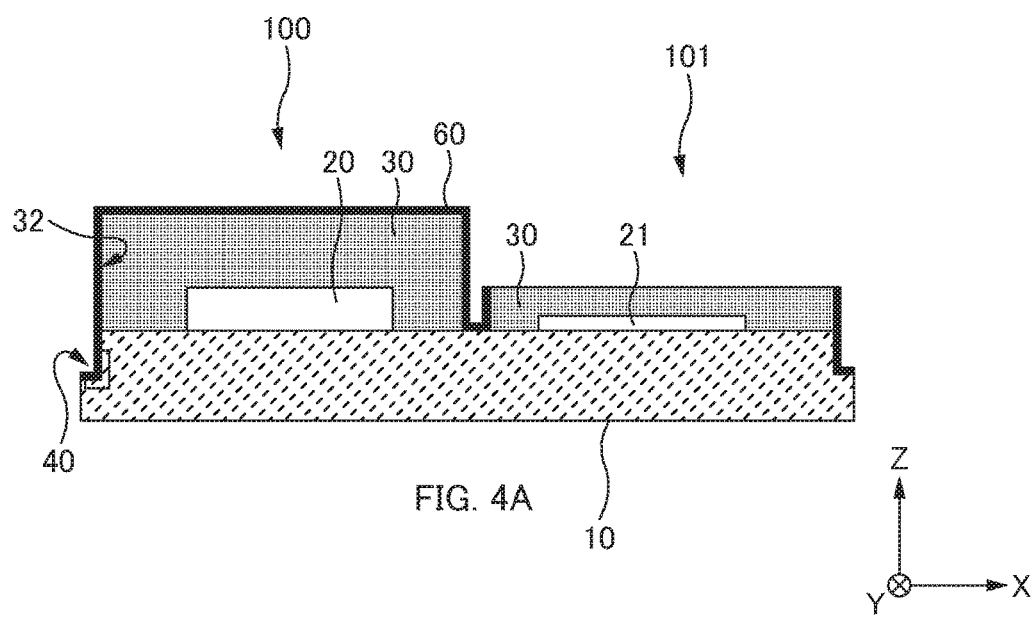
FIG. 4A is a schematic diagram illustrating an electronic component module according to a first embodiment where an antenna region is provided.
Figure 4B:
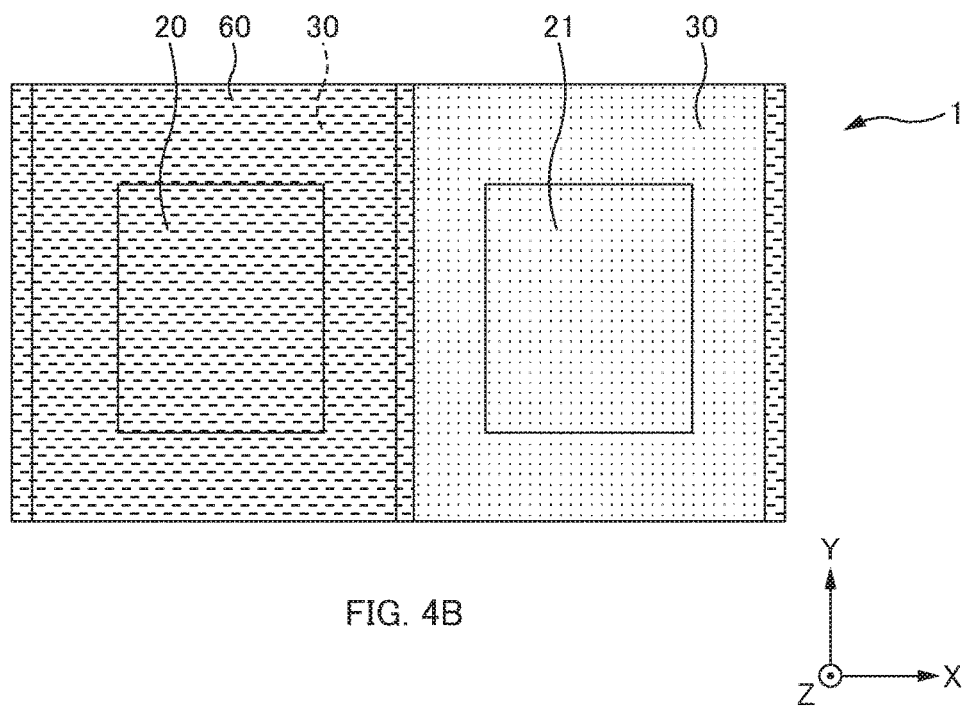
FIG. 4B is a schematic diagram illustrating an electronic component module according to a first embodiment where an antenna region is provided.

A configuration of an electronic component module 1 according to a first embodiment will be described with reference to FIGS. 1 to 4B. FIG. 1 is a schematic diagram illustrating the electronic component module 1 according to a first embodiment. FIGS. 2A and 2B are diagrams illustrating positional relationship of vias 53 (or through holes) formed inside the electronic component module 1 when viewed from the upper surface side of the electronic component module 1. FIGS. 3A and 3B are schematic diagrams illustrating the electronic component module 1 according to the first embodiment where a solid ground 54 is used. FIGS. 4A and 4B are schematic diagrams illustrating the electronic component module 1 according to the first embodiment where an antenna region 101 is provided.

As illustrated in FIG. 1, the electronic component module 1 comprises a substrate 10, the electronic component 20, a sealing portion 30, a contact portion 40, and a shielding film 60.

The substrate 10 is made of an insulating material, such as resin, silicon, alumina, glass, ceramics, a composite material, and includes a conductive pattern 11 (for example, ground wiring, Vcc, etc.) inside thereof. The conductive pattern 11 is configured to be connected with a GND, for example. Here, for example, the substrate 10 using silicon is a so-called silicon interposer. The silicon substrate 10 may have a semiconductor device comprising P-N junction formed therein or may be an intrinsic semiconductor device where no device is formed. It should be noted that the conductive pattern 11 is provided on an inorganic insulation layer or an organic insulation layer covered on an upper layer of the silicon substrate 10, and at least one layer of the conductive pattern 11 is formed. For example, the substrate 10 in FIG. 1 can be considered as being formed on a Si substrate.

As illustrated in FIG. 1, at least one layer of the conductive pattern 11 is formed in the substrate 10. Here, the substrate 10 includes four layers of the conductive patterns 11 formed on both surfaces of a core layer. The substrate 10 includes a via 53 configured to connect GND wiring patterns formed in different layers or electrically connect GND terminals to each other. Here, the via 53 may be a through hole provided to an upper layer or lower a layer with respect to an electrode. Hereinafter, it is assumed that the via 53 includes a through hole. It should be noted that the conductive pattern 11 includes: an electrode used for wire bonding, solder ball mounting, or the like; wiring extending from an electrode; a via electrode integrally formed on the upper and lower sides of a via or through hole; a through hole electrode; and the like, and the conductive pattern 11 is configured to be applied with a signal, or applied with Vcc, GND.

As illustrated in FIGS. 2A and 2B, the via 53 is disposed so as to overlap with a dicing line DL when viewed from the upper surface side. Accordingly, when a side surface of the electronic component module 1 is formed by dicing, the via 53 results in being exposed on the side surface. Incidentally, the dicing line DL is a virtual cutting line used for singulation performed by a cutting apparatus (dicing apparatus). However, since a blade of the cutting apparatus has a width, the dicing line DL is illustrated with a given width in FIGS. 2A and 2B.

A plurality of vias 53 is provided. In FIG. 2A, the vias 53 are arranged in a row along the dicing line DL, however, they may be provided so as to form a plurality of rows as illustrated in FIG. 2B. The vias 53 do not necessarily need to be regularly arranged, and may be irregularly arranged in the vicinity of the dicing line DL. Here, such an irregular arrangement of the vias 53 is referred to as a "random arrangement".

In both cases of FIGS. 2A and 2B, by causing the plurality of the vias 53 to overlap with the dicing line DL, the plurality of vias 53 are exposed on the side surface of the electronic component module 1, particularly, the side surface of the substrate 10. This increases the exposed area of a conductive portion serving as the contact portion 40. Accordingly, the contact area between the conductive portion, such as the via 53, and the shielding film 60, which will be describe later, is increased. Thus, the shielding film 60 is formed in the exposed conductive portion, such as the via 53, and thus it is possible to reduce contact resistance of the shielding film 60 in the contact portion 40 described later.

Further, the substrate 10 includes an electrode 52. The electrode 52 may be formed inside (inner layer) the substrate 10, or may be formed on a surface (for example, upper surface) of the substrate 10. It should be noted that the electrode 52 may be ground wiring. Further, the substrate 10 includes, for example, an external connection terminal 51 for connecting to the GND, for example, on the lower surface side of the electronic component module 1. This external connection terminal 51 is configured to be electrically connected to an electrode and/or wiring on the inner layer and/or the surface of the substrate 10, so that the electronic component 20 is connected to the electrode on the surface of the substrate 10.

The electronic component 20 is provided, for example, on the upper surface side of the substrate 10. Here, the electronic component 20 may include a passive element such as a resistor, inductor, and/or capacitor, in addition to a semiconductor chip. Further, the electronic component 20 may be an antenna, a filter, and/or the like.

The sealing portion 30 is a protective member that covers the electronic component 20 and the substrate 10. The sealing portion 30 is formed using thermosetting resin for molding, such as epoxy resin and cyanate resin. The sealing portion 30 includes an upper surface 31, a side surface 32 extending downward from an edge portion of the upper surface 31. Thus, a connecting portion between the upper surface 31 and the side surface 32 forms an edge portion 33. It should be noted that the sealing portion 30 is formed such that a thermosetting resin is cured by a transfer molding method, a thermoplastic resin is cured by injection molding method, or similar. Furthermore, an insulating resin may be printed by screen printing and cured, or an insulating resin may be coated by potting.

The contact portion 40 is a portion having a vertical surface and a horizontal surface that are formed with the electrode 52 and/or the via 53 (or a through hole) that are exposed by dicing. Further, the contact portion 40 is configured to be electrically connected to the external connection terminal 51 and the conductive pattern 11. The contact portion 40 may include at least one of the electrode 52, the via 53, or a through hole. That is, as illustrated in FIGS. 1 and 2, when the dicing line DL is set at a position overlapping with the electrode 52, the via 53, or a through hole and dicing is performed, a surface that has been ground of the electrode 52 and/or the via 53 is exposed on the side surface of the substrate 10, to form the contact portion 40. It should be noted that the contact portion 40 is configured to be electrically connected to the GND, for example, through the external connection terminal 51 or the conductive pattern 11, via the electrode 52, the via 53 or a through hole.

Further, as illustrated in FIGS. 3A and 3B, the contact portion 40 may include the solid ground 54. It should be noted that the solid ground 54 is a ground electrode provided to a predetermined insulation layer in the substrate 10, to have a planar extent (the solid ground indicates here that, for example, all, substantially all, or a half of a surface of a layer in a printed-circuit board is convered with GND metal. This can strengthen and solidify ground (GND)). For reference, FIG. 3B illustrates a relationship among the solid ground 54, the vias 53, and the dicing line DL when viewed from the upper surface. It should be noted that FIG. 3A illustrates the solid ground 54 as being provided to a front layer of the substrate, however, the solid ground 54 may be provided inside (inner layer) or on a back surface of the substrate 10. In this case, the via 53 or a through hole is formed on the lower side or the upper side of the solid ground 54.

The electrode 52, the via 53, a through hole, and the solid ground 54 formed at such positions result in being exposed on the side surface of the substrate 10 that has been ground by dicing, as described above. In such a state, the contact portion 40 includes: a vertical surface 41 (a face parallel to the YZ plane) of the substrate 10 continuous with the side surface 32 of the sealing portion 30; and a horizontal surface 42 (a face parallel to the XY plane) of the substrate 10 continuous with this vertical surface 41. A curved surface 43 lies between the vertical surface 41 and the horizontal surface 42. The curvature of a curve in the curved surface 43 varies with the degree of sharpness (at the time of designing or after wearing out) of a used blade of the cutting apparatus. However, it is desirable to satisfy the relationship of film thicknesses of the shielding film 60 which will be described later.

In a film forming method which will be described later, a film in the horizontal surface 42 is formed thick and a film in the vertical surface 41 is formed thinner than the film of the horizontal surface 42. Further, in the vertical surface 41, the film is formed thinner toward the −Z direction side. In view of the features of such a film forming method, the electrode 52 and/or the like is exposed on the horizontal surface 42 by virtue of the contact portion 40, and accordingly the shielding film 60 can be formed relatively thick on the electrode 52. Further, the electrode 52, the via 53, or a through hole is exposed on the vertical surface 41 and the curved surface 43 where the shielding film 60 is formed relatively thin, and thus the contact area can be increased. Accordingly, it becomes possible to reduce contact resistance between the contact portion 40 and the shielding film 60, thereby being able to enhance the effects of suppressing EMI by virtue of the shielding film 60. This is because the electrode 52 is formed using the solid ground 54, a plurality of vias 53 or through holes are formed in a row, and the like.

As can be applied in all the following embodiments, a portion corresponding to the horizontal surface 42 of the contact portion 40 may be a burr formed in the bottom surface when dicing. In FIGS. 1, 3A, 3B, 4A, and 4B, dicing is stopped halfway in the thickness direction of the substrate 10 such that the via 53 and/or the electrode 52 is exposed on the horizontal surface 42. It should be noted that when swarf, so-called burr, from the via 53 or the electrode 52 positioned on the lower side remains in the horizontal surface 42 integrally with the electrode 52 even after completely finishing shaving (grinding), the shielding film 60 may be deposited on this burr. Further, cutting on the dicing line DL may be performed by laser processing. Such cutting may be performed also by waterjet process, and this implements formation of a groove.

Vapor deposition, sputtering or CVD is used as the film forming method of forming the shielding film 60. The shielding film 60 is a conductive film that covers the upper surface 31 and side surface 32 of the sealing portion 30 and the contact portion 40. The shielding film 60 is configured to be electrically connected to the contact portion 40, and suppress an electromagnetic wave generated inside the electronic component module 1 from leaking to the outside. Alternatively, the shielding film 60 has a function of preventing external noise from entering into the module.

The shielding film 60 is made of a conductive metal material, such as Cu, Ni, Ti, Au, Ag, Pd, Pt, Fe, Cr, or SUS (stainless steel). Further, the shielding film 60 may be an alloy using some multiple materials of the aforementioned metal materials, or a laminated film using some multiple materials of the aforementioned metal materials. For example, a film (first film) is formed using Cu as a main material, and another film is further formed thereon using a noble metal such as SUS or Au.

Here, the film thickness of the shielding film 60 at various portions, which is formed by vapor deposition, sputtering, and the like, in which scattering is possible under a low vacuum, satisfy the following relationship. That is, the relationship of t11>t31 and further the relationship of t21>t31 or t41>t31 are satisfied, where t11 is a film thickness of the shielding film 60 on the upper surface 31 of the sealing portion 30, t21 is a film thickness of the shielding film 60 on the horizontal surface 42 of the contact portion 40, t31 is a film thickness of the shielding film 60 on the side surface 32 of the sealing portion 30, and t41 is a film thickness of the shielding film 60 on the curved surface 43 of the contact portion 40. When the shielding film 60 has at least such a thickness, the horizontal surface 42 and the curved surface 43 are coated thick with the shielding film 60, and thus contact with the contact portion 40 becomes preferable. Accordingly, it is possible to form the shielding film 60 that exhibits a contact resistance capable of suppressing an electromagnetic wave from leaking to the outside.

The above description has been made such that the electronic component 20 is provided on the upper surface side of the substrate 10, however, it is not limited thereto. For example, as illustrated in FIGS. 4A and 4B, a wireless region 100 where the electronic component 20 is disposed may be provided on one side on the upper surface of the substrate 10, while the antenna region 101 where a wiring pattern serving as an antenna 21 may be provided on the other side on the upper surface of the substrate 10. Even in this case, the contact portion 40 is formed in the same manner as described above.

==Method of Manufacturing Electronic Component Module 1==

Figure 5A:
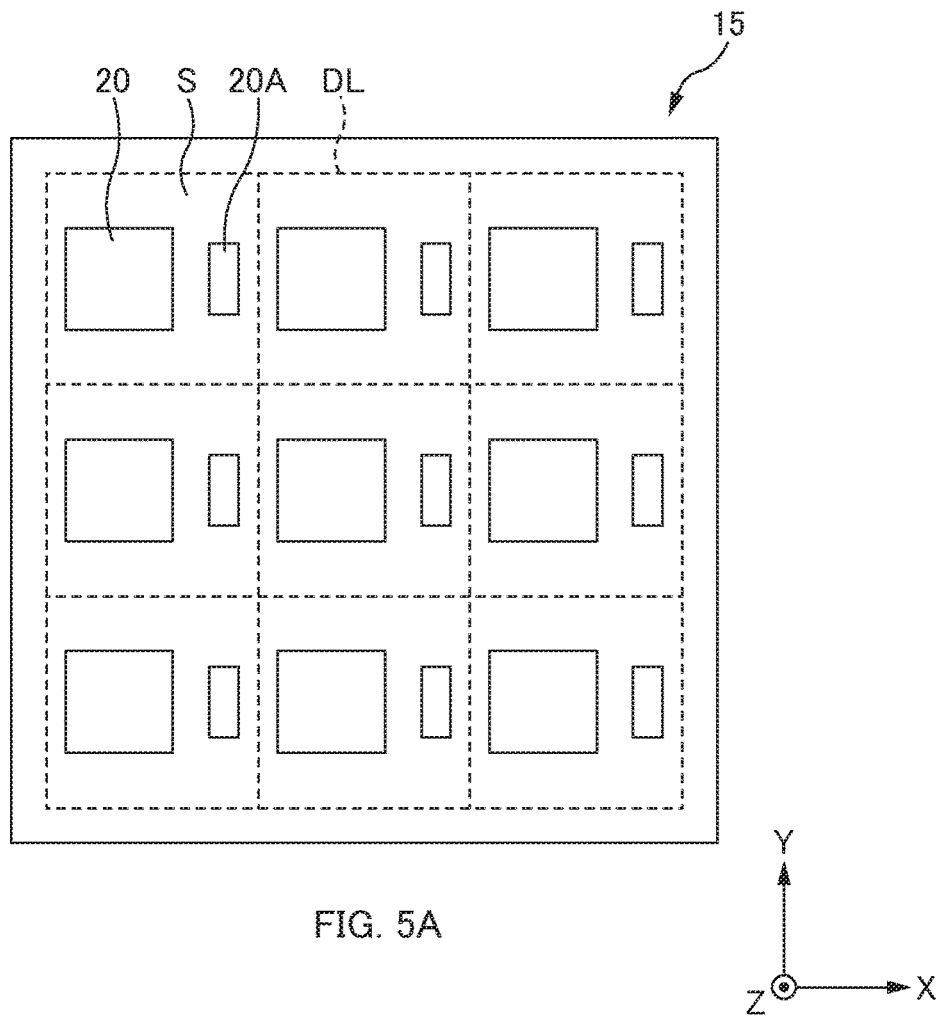
FIG. 5A is a schematic diagram illustrating a process of placing electronic components on an assembly substrate, in a process of manufacturing an electronic component module of FIG. 1.
Figure 5B:
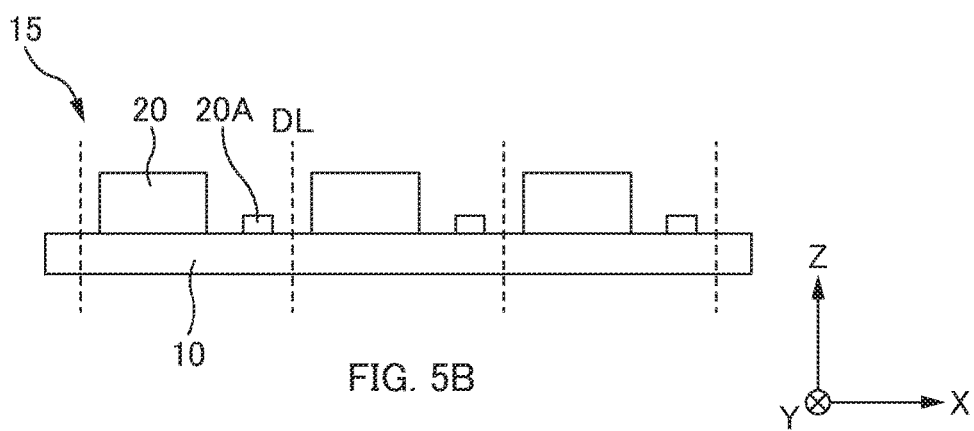
FIG. 5B is a schematic diagram illustrating a process of placing electronic components on an assembly substrate, in a process of manufacturing an electronic component module of FIG. 1.
Figure 6A:
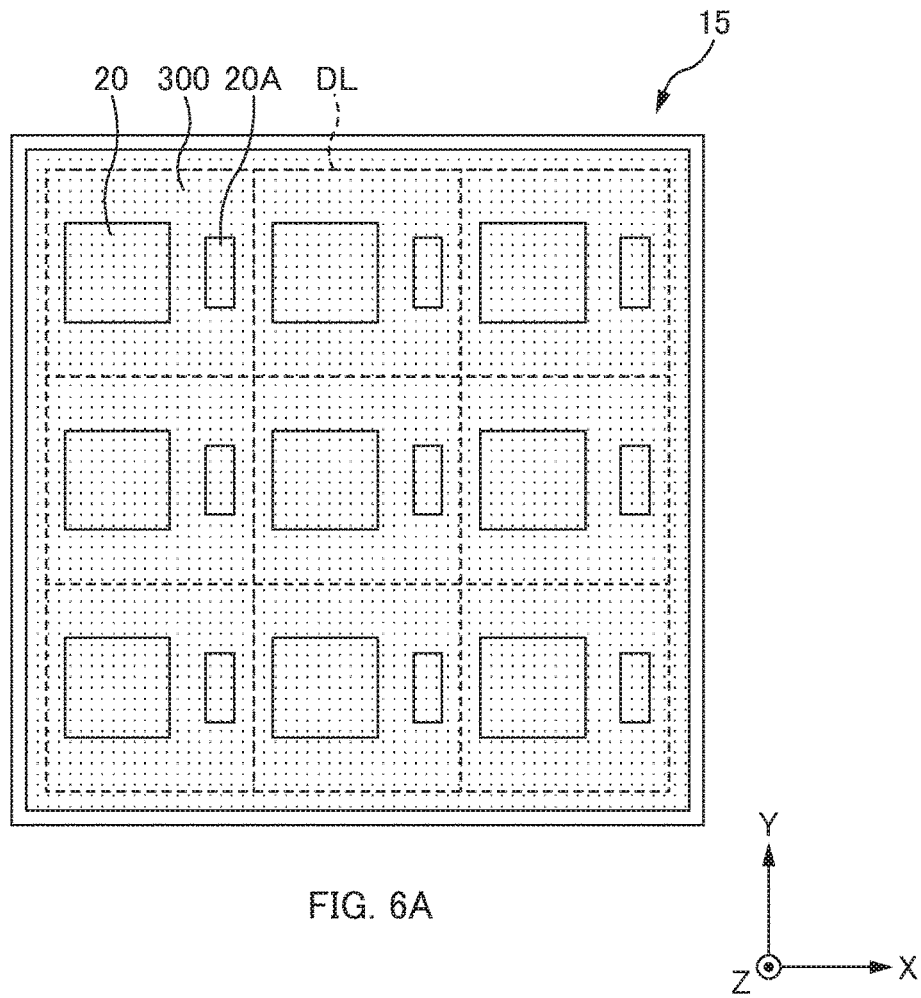
FIG. 6A is a schematic diagram illustrating a process of sealing an assembly substrate and electronic components with an insulating material, in a process of manufacturing an electronic component module of FIG. 1.
Figure 6B:
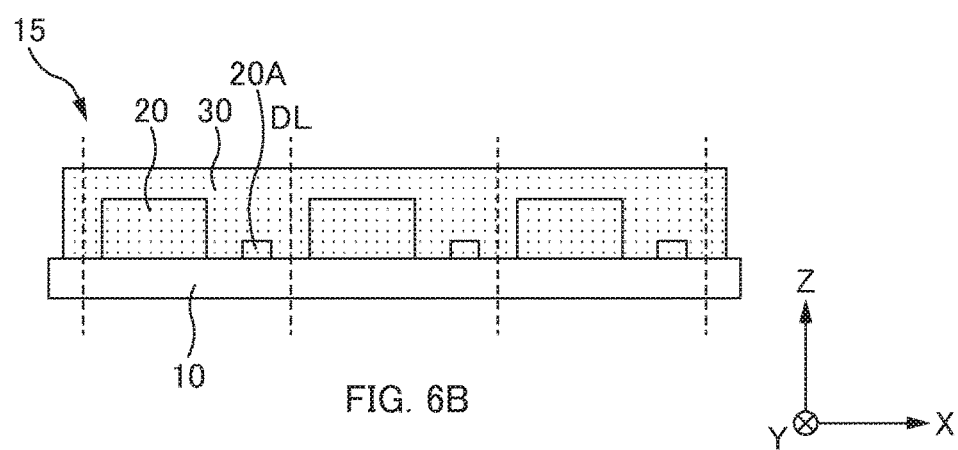
FIG. 6B is a schematic diagram illustrating a process of sealing an assembly substrate and electronic components with an insulating material, in a process of manufacturing an electronic component module of FIG. 1.
Figure 7A:
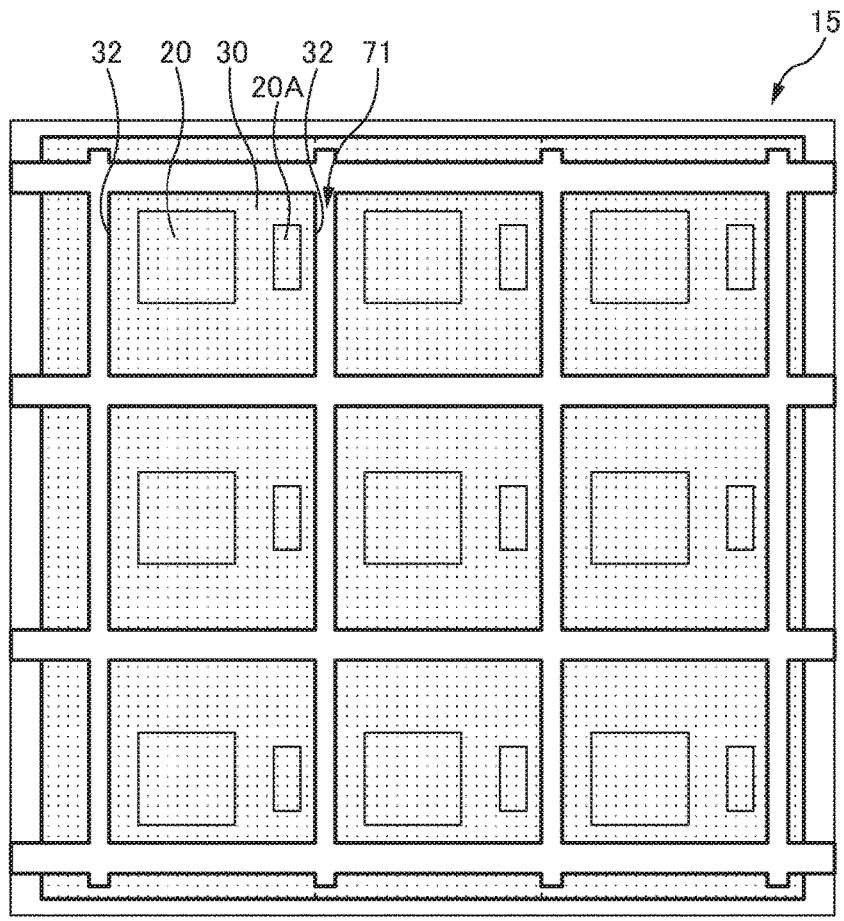
FIG. 7A is a schematic diagram illustrating a process of forming a groove, in a process of manufacturing an electronic component module of FIG. 1.
Figure 7B:
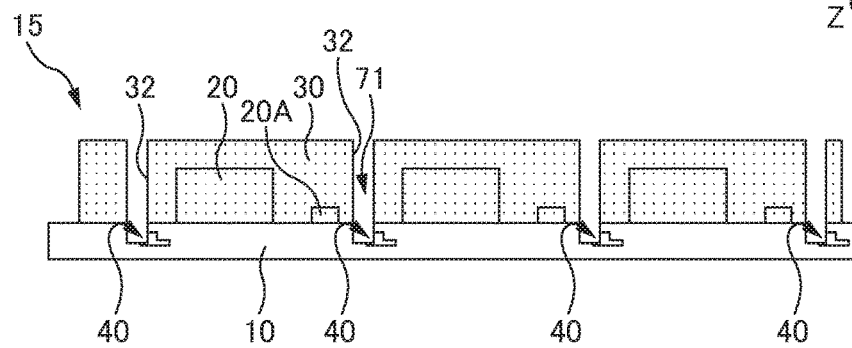
FIG. 7B is a schematic diagram illustrating a process of forming a groove, in a process of manufacturing an electronic component module of FIG. 1.
Figure 8:
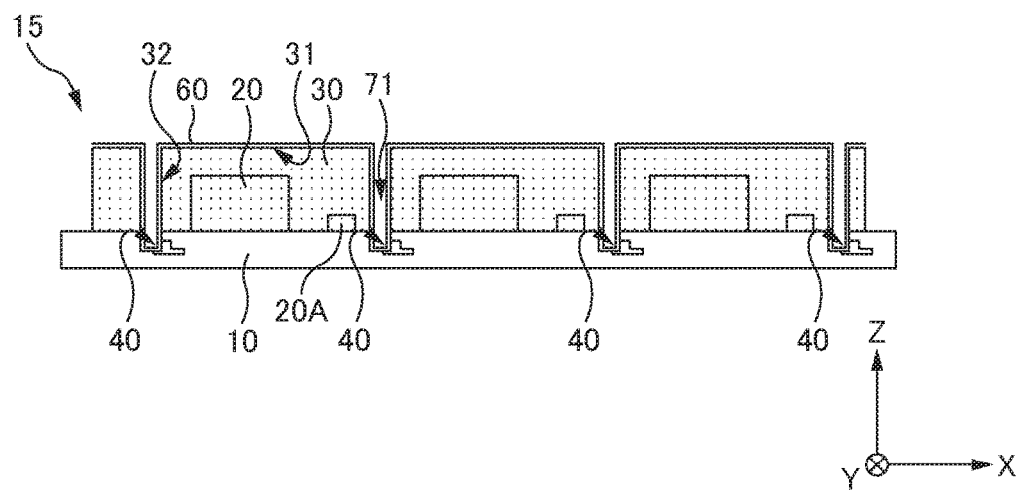
FIG. 8 is a schematic diagram illustrating a process of forming a shielding film, in a process of manufacturing an electronic component module of FIG. 1.
Figure 9:
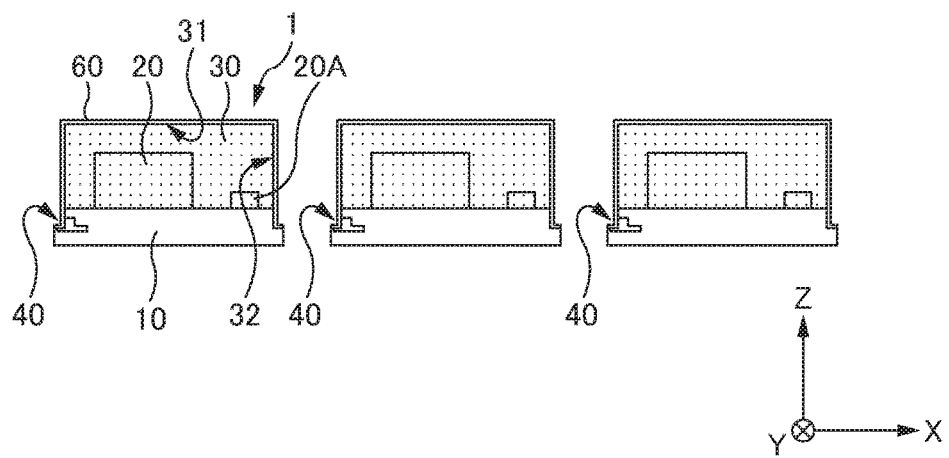
FIG. 9 is a schematic diagram illustrating a process of singulating electronic component modules, in a process of manufacturing an electronic component module of FIG. 1.
Figure 10:
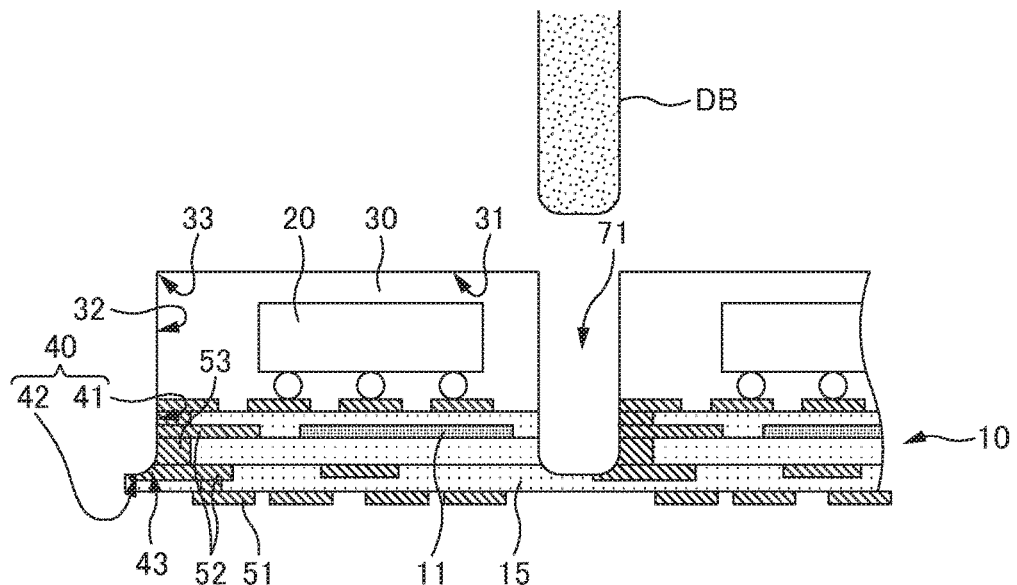
FIG. 10 is a diagram illustrating, in detail, a process of forming a first groove shown in FIG. 7B.
Figure 11:
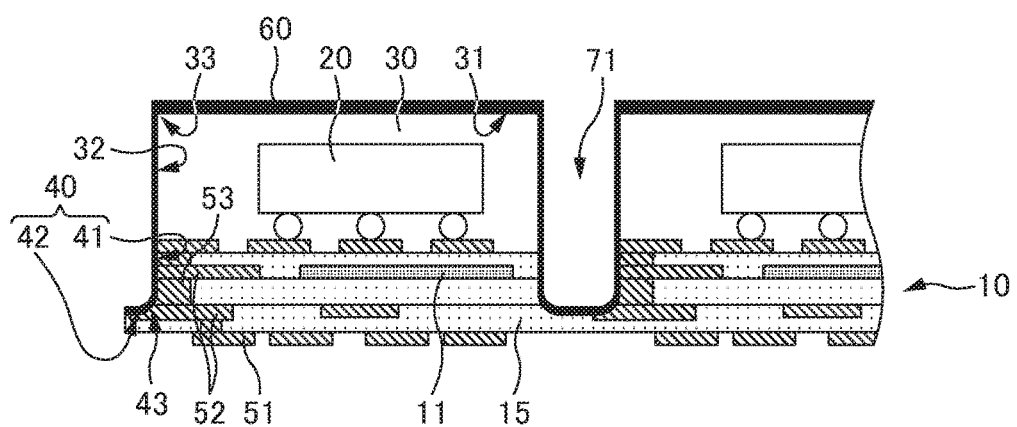
FIG. 11 is a diagram illustrating, in detail, a process of forming a shielding film shown in FIG. 8.

A method of manufacturing the electronic component module 1 including the above described configuration will be described with reference to FIGS. 5A to 11. FIGS. 5A to 11 are diagrams illustrating a process of manufacturing the electronic component module 1. In specific, FIGS. 5A and 5B illustrate a process of placing the electronic components 20, 20A on an assembly substrate 15, FIGS. 6A and 6B illustrate a process of sealing the assembly substrate 15 and the electronic component 20 with an insulating material, FIGS. 7A and 7B illustrate a process of forming a groove 71, FIG. 8 illustrates a process of forming the shielding film 60, and FIG. 9 illustrates a process of singulating the electronic component modules 1. In FIGS. 5A to 9, the configuration of the electronic component module 1 is simplified for convenience sake. Further, FIG. 10 illustrates, in detail, a process of forming the groove 71 shown in FIG. 7B, and FIG. 11 illustrates, in detail, a process of forming the shielding film 60 shown in FIG. 8.

First, as illustrated in FIGS. 5A and 5B, the substrate 10 where the conductive patterns 11 (not shown) are prepared, and the electronic components 20 are arranged in regions (component mounting region) S that are set in advance in the upper surface of this substrate 10. In the substrate 10, the dicing line (dicing region) DL, which is to be cut off by dicing, is set in advance with a predetermined width between component mounting regions S adjacent to each other. It should be noted that the electronic component 20 is a tall electronic component such as a semiconductor package where a semiconductor IC chip, BGA, and/or the like is sealed therein. On the other hand, the electronic component 20A is a short electronic component for implementing a desired function including the aforementioned electronic component 20, which is, here, a chip resistor, a chip capacitor, solenoid, and/or the like. As a matter of course, at least one or more of the electronic components 20, 20A are disposed according to the size and function to be implemented.

Next, as illustrated in FIGS. 6A and 6B, the electronic component 20 and the upper surface of the substrate 10 are covered with an insulating material, to form the assembly substrate 15 including the sealing portion 30. With respect to the assembly substrate 15 in such a state, transfer-molding may be performed using a thermosetting resin, injection-molding may be performed using a thermoplastic resin, or sealing and curing may be performed by potting. Further, a sealing resin may be printed by screen printing and cured.

Then, as illustrated in FIGS. 7A and 7B, the groove 71 is formed by grinding from the upper surface of the sealing portion 30 to the substrate 10 along a dicing region DL using a blade having a given width, for example, as of a dicing apparatus (grinding apparatus). Accordingly, the groove 71 is formed so as to surround the component mounting region S. Further, the side surface 32 is formed in the sealing portion 30 and the substrate 10.

At this time, as illustrated in FIGS. 7B and 10, grinding is performed from the upper surface to the inner layer of the substrate 10 such that the side surface of the substrate 10 is exposed. That is, grinding (so-called half-cut dicing) is performed until it reaches the inside of the substrate 10. As a result, at least one of the electrode 52, the via 53, or a through hole is exposed on the vertical surface 41 of the substrate 10. Then, such at least one thereof is exposed also on the horizontal surface 42, to form the contact portion 40.

Next, as illustrated in FIGS. 8 and 11, the shielding film 60 is formed on the upper surface 31 and the side surface 32 of the sealing portion 30 using a conductive material. A film forming process is performed by a vacuum film-forming process, such as vapor deposition, sputtering or CVD (chemical vapor deposition). At this time, the electrode 52, the via 53, a through hole, and/or the like exposed in the contact portion 40 is covered with the shielding film 60 to form a film. In specific, coating is performed onto a portion including the horizontal surface 42 and the curved surface 43, and thus it is possible to ensure a thick film thickness of the shielding film 60 at the portion, thereby being able to reduce contact resistance of the contact portion 40 and the shielding film 60.

Finally, as illustrated in FIG. 9, the dicing region DL is further ground, to separate the assembly substrate 15, thereby producing the electronic component modules 1. It is preferable that the width of a blade of the cutting apparatus used at this occasion is smaller than the width of the groove 71 so that the shielding film 60 is not damaged and further a shoulder of the above-described contact portion 40 is easily formed. Accordingly, the singulated substrate 10 is slightly protruded to the outside from the side surface 32 of the sealing portion 30, which is a dicing surface, and the cross-section of the shielding film 60 has an L-shape.

==Method of Forming Shielding Film 60==

Here, the reason why vapor deposition, sputtering or CVD is used as a method of forming the shielding film 60 will be described. In general, the method of forming a shielding film includes plating, printing of conductive paste, sputtering, vapor deposition, CVD, and the like.

Plating uses a plating solution for immersion, and thus is not so preferable in terms of reliability of a package, and further, plating has also issues in facility and waste such as effluent processing. Printing of conductive paste uses a resin paste mixed with noble metal. However, such a material is expensive, and there is a tendency that electrical resistance increases since resin exists among metal particles. Furthermore, shielding performance cannot be enhanced unless the conductive paste is applied relatively thick. On the other hand, the vacuum film-forming method (vapor deposition, sputtering, or CVD) does not have the above-described issues, and is excellent in reliability and uniformity in film thickness of a shielding film. Thus, in an embodiment of the present disclosure, the vacuum film-forming method is employed as the film forming method. Hereinafter, a case of employing sputtering as an example of the vacuum film-forming method will be described, however, a film can be formed similarly by vapor deposition or CVD as well.

Sputtering is advantageous in that contact resistance is low and a film thickness can be made smaller than a film thickness formed using conductive paste, since metal particles (matters scattered by sputtering) are deposited in a layer manner. However, it is difficult to ensure a film thickness on the side surface side of the sealing portion 30 and the substrate 10, since it is difficult for sputtered particles to enter the narrow dicing groove and also the sputtered particles tend to travel straight to some extent.

Accordingly, for example, sputtering is commonly performed after singulation of packages. At this occasion, the film thickness of the shielding film is ensured by ensuring a predetermined space between individual pieces. However, a common method is inferior in terms of mass productivity as compared with manufacturing in a state of an assembly substrate.

In sputtering, due to the above-described directional characteristics or characteristics of traveling straight of the particles of a film-forming material, if a space between the packages (modules) is narrow, the film thickness of the shielding film formed on the side surface of a package tends to become smaller than the film thickness of the shielding film formed on the upper surface of the package.

In view of such a point, in an embodiment of the present disclosure, when the groove 71 is formed by dicing, at least the electrode 52 or the via 53 is partially cut, to expose the vertical surface 41, the horizontal surface 42, and the curved surface 43 of the contact portion 40, as described in FIG. 1. It should be noted that, preferably, all of the electrode 52, the via 53 in the lower layer, the underlying electrode 52, and the like are exposed on the side surface of the substrate 10, as illustrated in FIG. 1. In specific, in order to expose the electrode 52, wiring, or the via 53 on the horizontal surface 42, the groove is formed by half-cut dicing. To expose a conductive material on the horizontal surface 42, dicing must be stopped somewhere in the electrode 52 or the via 53 in the thickness direction. In general, the electrode 52 is thicker than the via 53, and thus it is preferable to stop dicing at a part of the via 53. As illustrated in FIG. 2A, when a plurality of vias 53 and/or through holes are provided in an aligned manner, the plurality of vias 53 and/or through holes are exposed on a dicing surface, so that the large exposed area can be ensured. On the other hand, in view of the exposed area in a plan view, the electrode 52 and the solid ground 54 are more advantageous in that the larger exposed area can be ensured than the exposed area of the via 53. Thus, it is preferable that, as illustrated in FIG. 2A, the aligned vias 53 and/or through holes are exposed on the side surface, and as illustrated in FIG. 1, dicing is stopped at the lower ends of the vias 53 or through holes, or a part of the electrode 52 on the lower end. Accordingly, the plurality of vias 53 or the electrode 52 is exposed on the horizontal surface 42. When a film is formed in this state, as illustrated in FIG. 1, the film thicknesses t21, t41 of the shielding film 60 formed on the horizontal surface 42 and the curved surface 43 result in being greater than the film thickness t31 of the shielding film 60 formed on the vertical surface 41. This can reduce contact resistance between the shielding film 60 and the curved surface 43 and horizontal surface 42.

Further, provision of the curved surface 43 is advantageous in that the contact area can be further increased. It is preferable to provide a curved portion in a dicing blade.

As such, in a first embodiment, it becomes possible to form the shielding film 60 in the state of the assembly substrate 15, and thus rearrangement and tape fixing of semiconductor packages when film formation is performed after singulation is unnecessary. Further, it is possible to reduce manufacturing cost since productivity is enhanced. Further, it is possible to improve quality and yields, since there is no wraparound of a film forming material to the back side of the substrate, as in the case where film formation is performed after singulation. Furthermore, the side surface of the substrate 10 includes the horizontal surface 42, and a conductive material is exposed on the horizontal surface 42. Accordingly, scattered matters under low vacuum can form the shielding film 60 on the horizontal surface 42 to have a film thickness greater than that of the vertical surface 41, so that the large deposited volume can be ensured. This is advantageous in that film formation can be performed without deterioration of the function as the shielding film 60.

Modified Example 1 of First Embodiment

Figure 12:
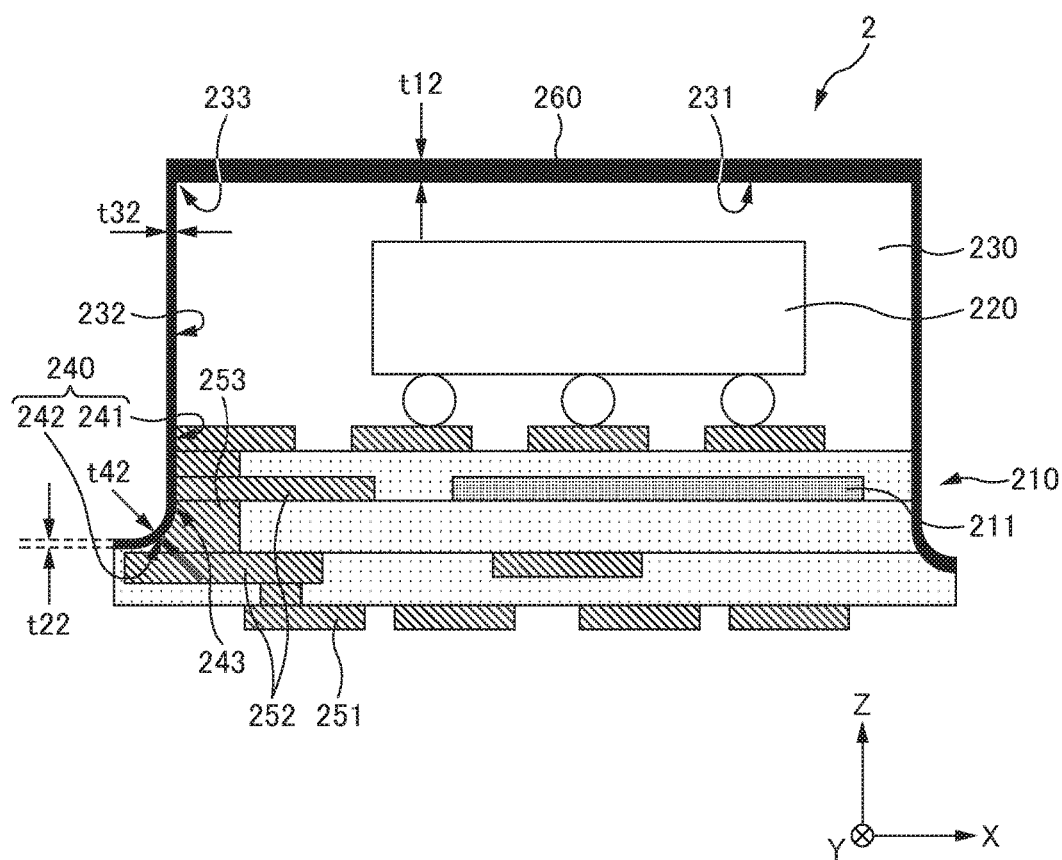
FIG. 12 is a schematic diagram illustrating an electronic component module according to a modified example 1 of a first embodiment.

A modified example 1 will be described with reference to FIG. 12. FIG. 12 is a schematic diagram illustrating an electronic component module 2 according to the modified example 1.

The electronic component module 2 according to the modified example 1 includes a substrate 210, an electronic component 220, a sealing portion 230, a contact portion 240, and a shielding film 260, similarly to the first embodiment. However, the contact portion 240 is constituted by at least either of a via 253 (including a through hole) and an electrode 252. It should be noted that, in an embodiment of the present disclosure, the electrode 252 is not included in the contact portion 240. That is, this embodiment of the present disclosure is a case where the blade edge of a dicing blade does not reach the electrode 252 when forming a groove by dicing.

In this case as well, at least a vertical surface 241 is formed such that the contact portion 240 is configured at least one of the via 253 or the electrode 252. It should be noted that, as illustrated in FIG. 12, a horizontal surface 242 and a curved surface 243 may be formed in addition to the vertical surface 241. As a result, the contact area between the contact portion 240 and the shielding film 260 can be sufficiently ensured.

A method of manufacturing the electronic component module 2 according to the modified example 1 is similar to the method in the first embodiment. However, the electrode 52 of the lower layer is exposed on the horizontal surface in FIG. 1, whereas a part of the via 253 is exposed on the horizontal surface 242, in FIG. 12, such that dicing is finished before the blade edge of a dicing blade reaches the electrode 252 of the lower layer, when a groove is formed.

In the modified example 1, it is possible to form a dicing groove to have a relatively shallow depth. Thus, in the film forming process, the shielding film 260 having a sufficient film thickness can be formed on the side surface of the dicing groove, even near the bottom surface (horizontal surface 242) of the groove. Accordingly, it is possible to reduce contact resistance between the shielding film 260 and the contact portion 240, and minimize breaking and/or peeling off of the shielding film 260, thereby being able to enhance quality of the electronic component module 2.

Second Embodiment

Figure 13:
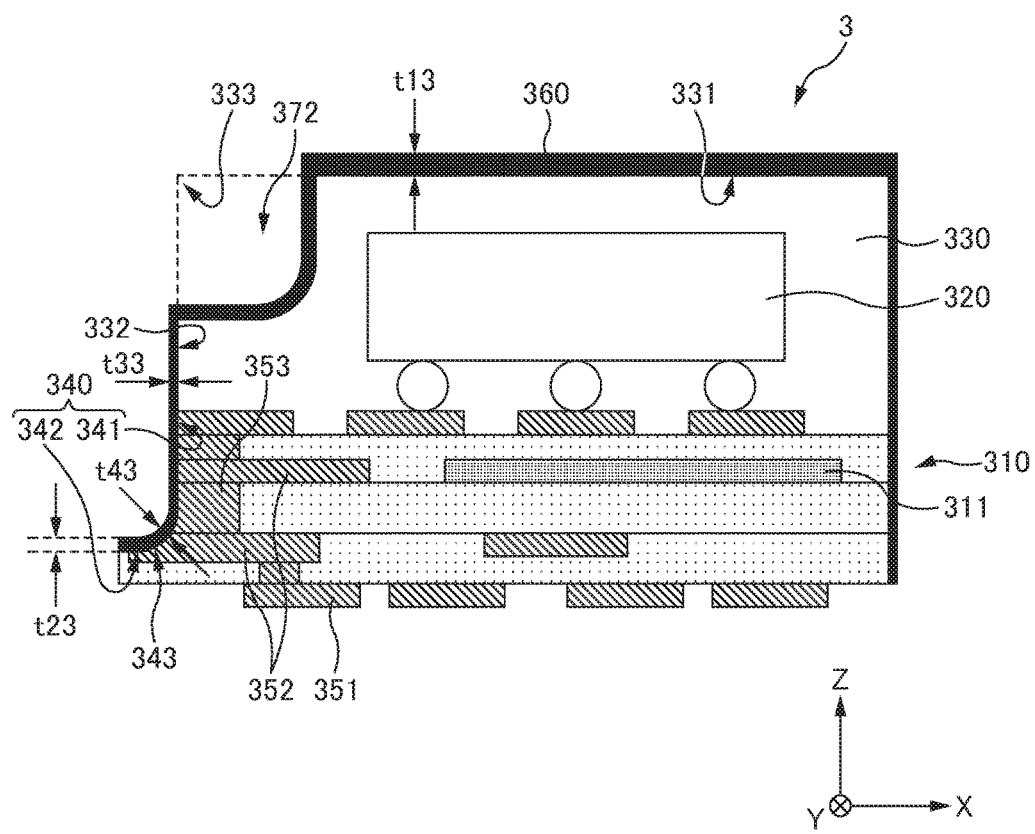
FIG. 13 is a schematic diagram illustrating an electronic component module according to a second embodiment.
Figure 14A:
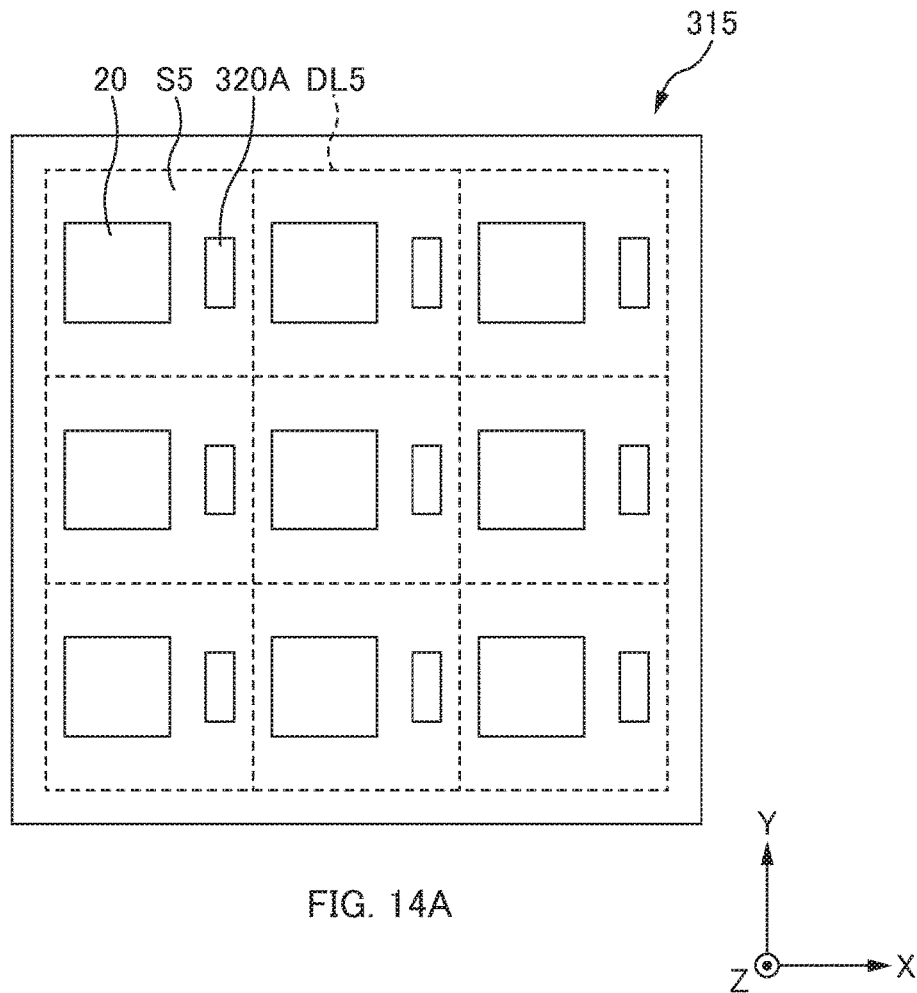
FIG. 14A is a schematic diagram illustrating a process of placing electronic components on an assembly substrate, in a process of manufacturing an electronic component module of FIG. 13.
Figure 14B:
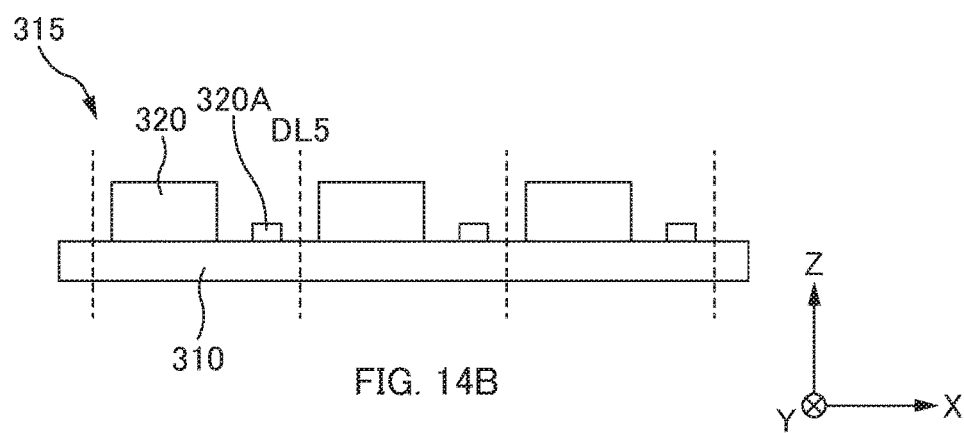
FIG. 14B is a schematic diagram illustrating a process of placing electronic components on an assembly substrate, in a process of manufacturing an electronic component module of FIG. 13.
Figure 15A:
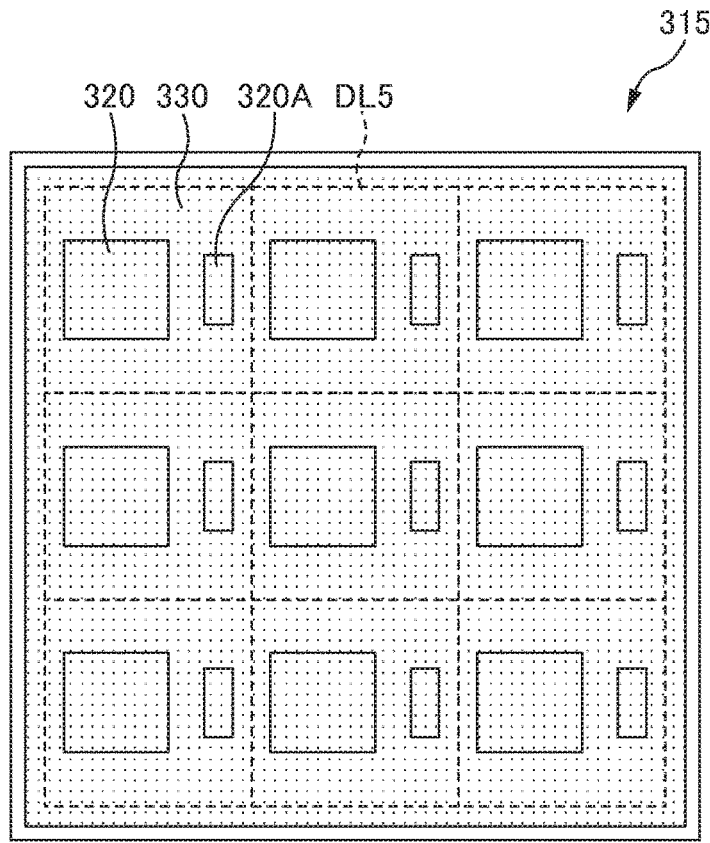
FIG. 15A is a schematic diagram illustrating a process of sealing an assembly substrate and electronic components with an insulating material, in a process of manufacturing an electronic component module of FIG. 13.
Figure 15B:
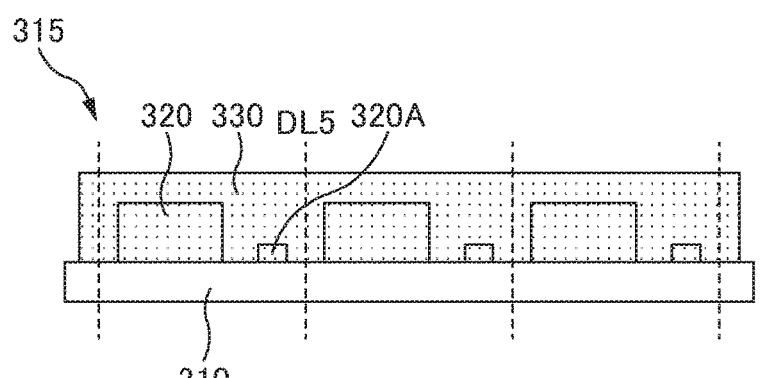
FIG. 15B is a schematic diagram illustrating a process of sealing an assembly substrate and electronic components with an insulating material, in a process of manufacturing an electronic component module of FIG. 13.
Figure 16A:
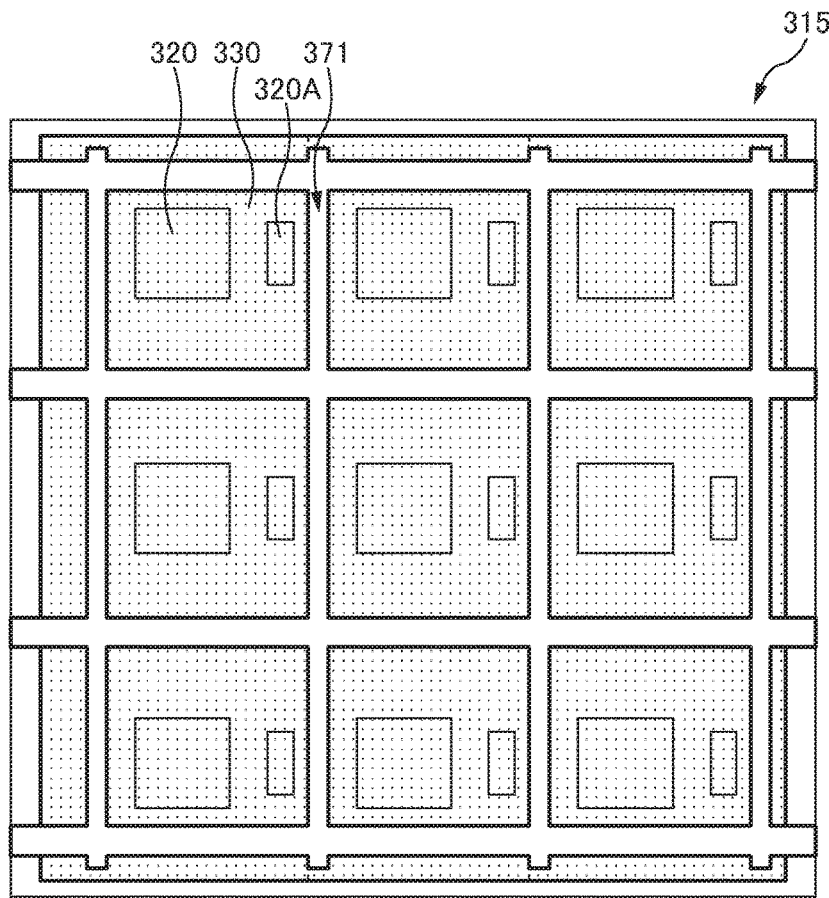
FIG. 16A is a schematic diagram illustrating a process of forming a groove, in a process of manufacturing an electronic component module of FIG. 13.
Figure 16B:
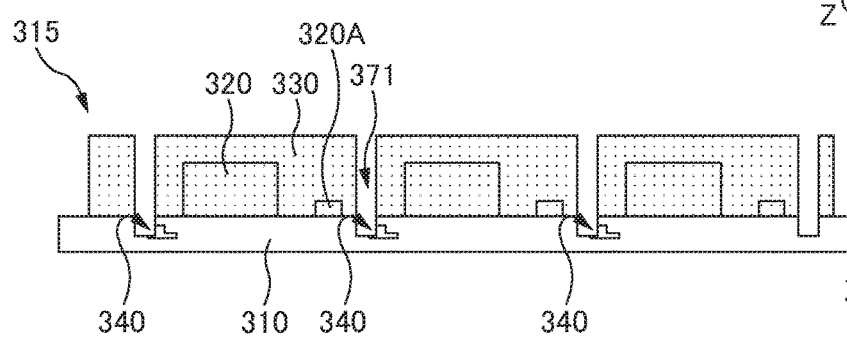
FIG. 16B is a schematic diagram illustrating a process of forming a groove, in a process of manufacturing an electronic component module of FIG. 13.
Figure 17A:
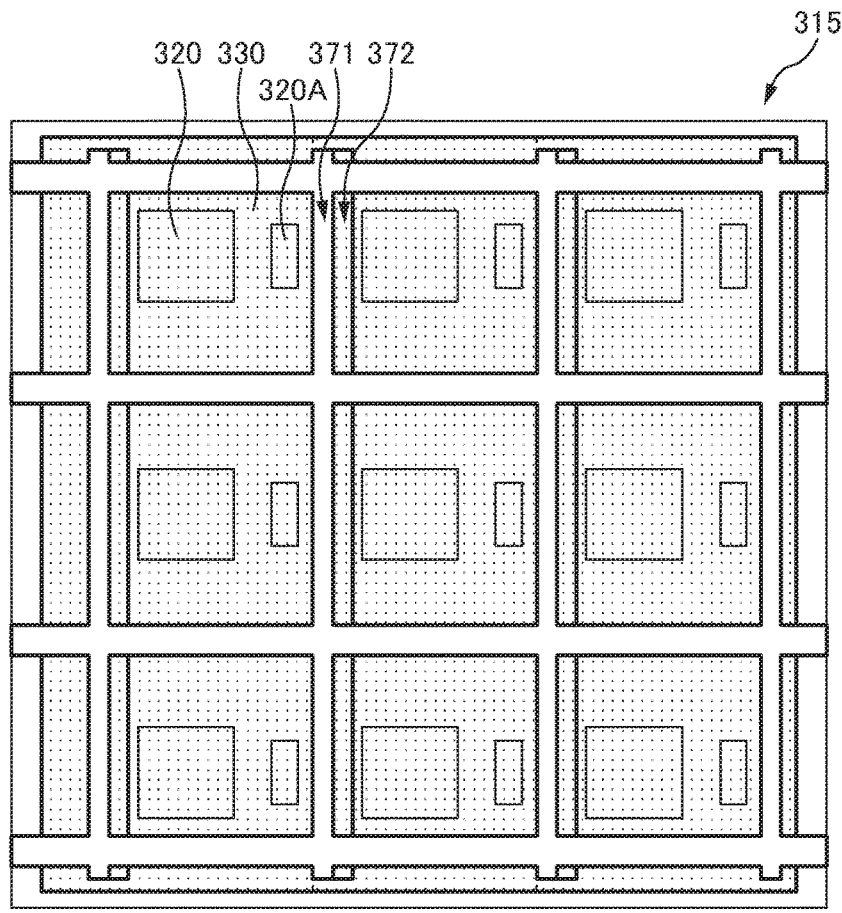
FIG. 17A is a schematic diagram illustrating a process of forming a removal portion, in a process of manufacturing an electronic component module of FIG. 13.
Figure 17B:
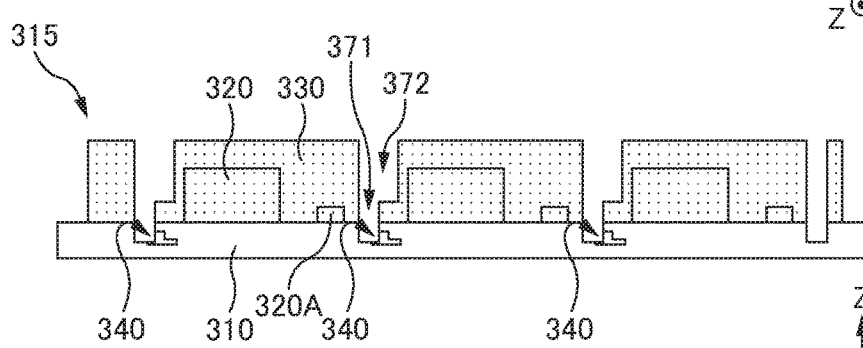
FIG. 17B is a schematic diagram illustrating a process of forming a removal portion, in a process of manufacturing an electronic component module of FIG. 13.
Figure 18:
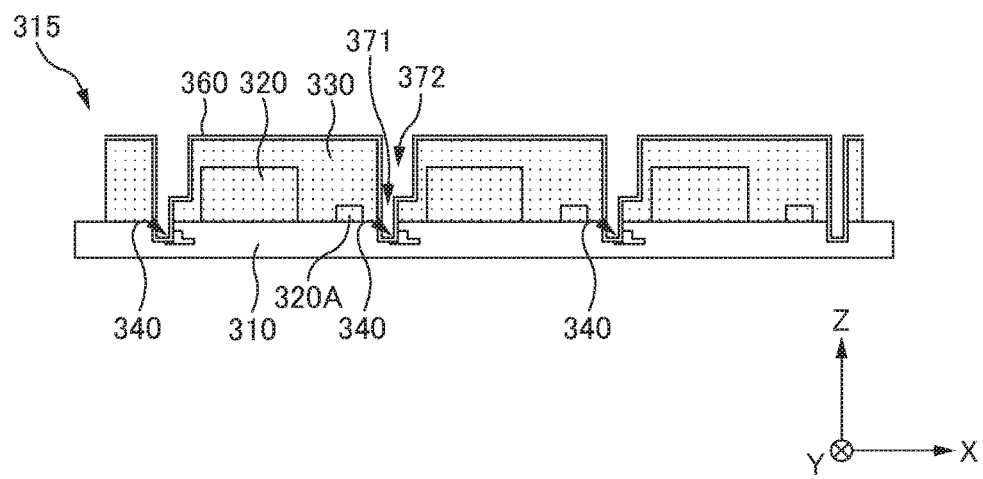
FIG. 18 is a schematic diagram illustrating a process of forming a shielding film, in a process of manufacturing an electronic component module of FIG. 13.
Figure 19:
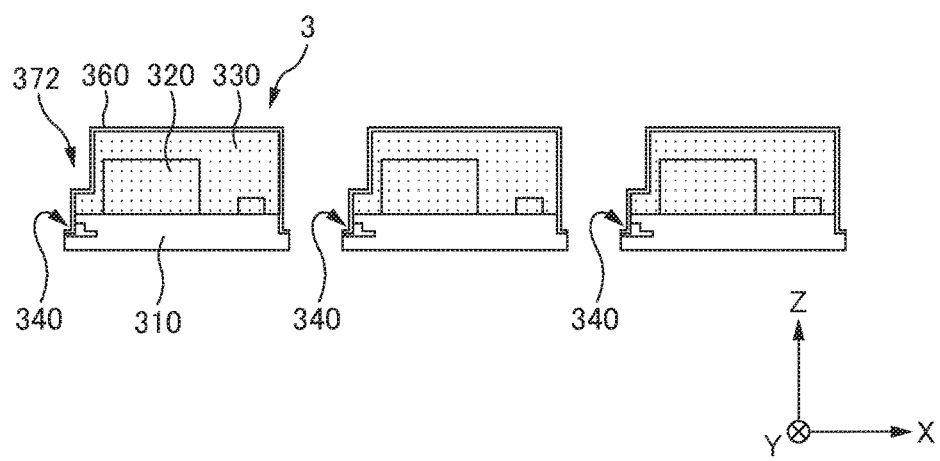
FIG. 19 is a schematic diagram illustrating a process of singulating electronic component modules, in a process of manufacturing an electronic component module of FIG. 13.
Figure 20:
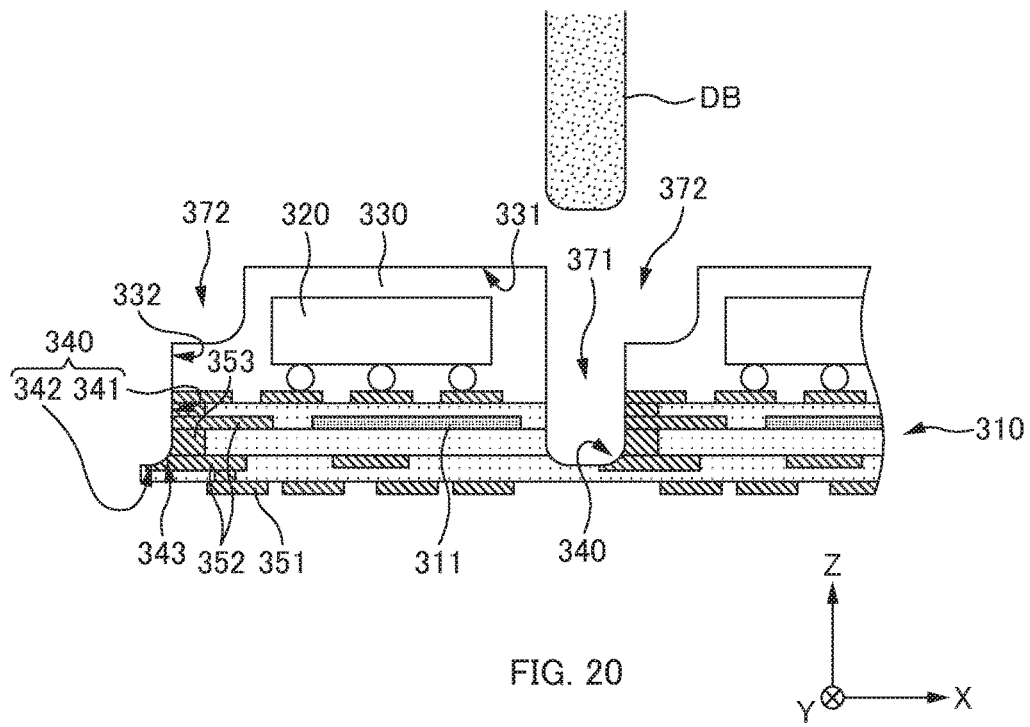
FIG. 20 is a diagram illustrating, in detail, a process of forming a groove and a removal portion shown in FIGS. 16B and 17B.
Figure 21:
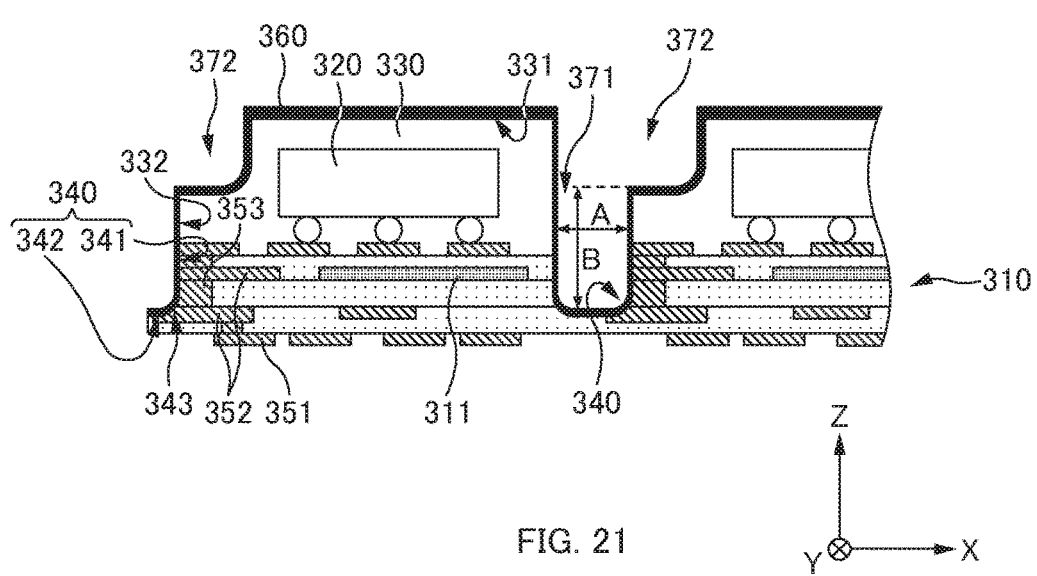
FIG. 21 is a diagram illustrating, in detail, a process of forming a shielding film shown in FIG. 18.

An electronic component module 3 according to a second embodiment will be described with reference to FIGS. 13 to 21. FIG. 13 is a schematic diagram illustrating the electronic component module 3 according to the second embodiment. FIGS. 14A to 19 are diagrams illustrating a process of manufacturing the electronic component module 3. In specific, FIGS. 14A and 14B illustrate a process of placing an electronic components 320 onto an assembly substrate 315, FIGS. 15A and 15B illustrate a process of sealing the assembly substrate 315 and the electronic components 320 with an insulating material, FIGS. 16A and 16B illustrates a process of forming a groove 371, FIGS. 17A and 17B illustrates a process of forming a removal portion 372, FIG. 18 illustrates a process of forming a shielding film 360, and FIG. 19 illustrates a process of singulating the electronic component modules 3. In FIGS. 14A to 19, the configuration of the electronic component module 1 is simplified for convenience sake. Further, FIG. 20 illustrates, in detail, a process of forming the groove 371 and the removal portion 372, and FIG. 21 illustrates, in detail, a process of forming the shielding film 360.

The electronic component module 3 according to the second embodiment includes a substrate 310, the electronic component 320, a sealing portion 330, a contact portion 340, and the shielding film 360, similarly to the first embodiment, and further includes the removal portion 372 (second groove) as illustrated in FIG. 13.

The removal portion 372 is formed by cutting off an edge portion 333 formed by an upper surface 331 and a side surface 332 of the sealing portion 330 (also defined as a connection portion between the upper surface 331 and the side surface 332, or an edge portion of the upper surface 331). The removal portion 372 is a region (space) where a conductive material scattered under a vacuum atmosphere having a pressure lower than atmospheric pressure is allowed to pass therethrough, when the contact portion 340 is covered with the shielding film 360. As illustrated in FIG. 13, in the second embodiment, the edge portion 333 is positioned at an upper end of the side surface 332 where the contact portion 340 is formed.

The removal portion 372 is groove-shaped in the second embodiment, but it is not limited thereto. The removal portion 372 may be a slope inclined outward (on the negative or positive side in the X-axis in FIG. 13) as in a modified example 1 of a third embodiment described later (see FIG. 25). Hereinafter, the second groove is not limited to the shape as of the removal portion 372 in the second embodiment, but includes a shape as of the removal portion 572 in the modified example 1 of the third embodiment described later.

Since the removal portion 372 is formed as such, the scattering particles of a conductive material can be scattered onto the contact portion 340 through the space (region) of the removal portion 372, in the process of forming the shielding film 360. That is, the removal portion 372 is provided to ensure a space capacity, resulting in a passage area, and further, there is an advantage of being able to ensure the amount of the particles scattered onto the contact portion 340 since the aspect ratio of the groove 371 can be made smaller. More preferably, the removal portion 372 is formed such that a length (distance) B of the side surface from the bottom surface of the groove 371 to the bottom surface of the removal portion 372 is twice or smaller with respect to the width of the groove 371.

Further, it is preferable that the removal portion 372 is formed vertically above the electronic component 320 (not shown). That is, it is preferable that the removal portion 372 is disposed so as to overlap with all or a part of the electronic component 320 when viewed from the upper surface side. With such an arrangement, it is possible to reduce the size and cost of the electronic component module 3.

Thus, it becomes possible to form the shielding film 360 having a sufficient film thickness onto a side surface of a package even in a case where intervals between packages on the assembly substrate 315 (i.e., a width of the groove 371) is small. This enhances productivity of the electronic component module 3.

A method of manufacturing the electronic component module 3 having such a configuration will be described. Here, the substrate 310 as an example of a first insulating substrate is included in the assembly substrate 315 as an example of a second insulating substrate, and the substrate 310 indicates a substrate eventually obtained by singulation.

First, the assembly substrate 315 (second insulating substrate 315) is prepared as in FIGS. 14A and 14B. The second insulating substrate 315 is formed such that a plurality of component mounting regions S5, where the electronic components 320 are disposed, are disposed on the substrate 310, and the second insulating substrate 315 includes a dicing line (dicing region) DL5 between the component mounting regions S5 adjacent to each other. Subsequently, as illustrated in FIG. 15, the sealing portion 330 is provided which covers a surface, where the electronic components 320 are provided, with an insulating material.

Next, as illustrated in FIGS. 16A and 16B, the dicing region DL5 is ground by a grinding apparatus to form the groove 371 (first groove), such that the side surfaces 332 of the sealing portions 330 are formed so as to surround the component mounting regions S5. In specific, half-cut dicing is performed for a surface of the substrate 310, to form the first groove 371 such that a side surface of the substrate 310 is exposed. Accordingly, the contact portion 340 is formed.

After the first groove 371 is formed, the removal portion 372 (second groove) is formed as illustrated in FIGS. 17A and 17B. As illustrated in FIG. 20, the second groove 372 is formed on the front surface 331 side of the sealing portion 330, so as to be continuous with the first groove 371, has a width equal to or greater than the width of the first groove 371, and has a depth shallower than the first groove 371. As a result, in a downstream process, the shielding film 360 can be formed to have a sufficient film thickness on a side surface of a package, even in a case where intervals between packages on the assembly substrate 315 (i.e., a width of the groove 371) is small.

Then, as illustrated in FIG. 18, the shielding film 360 is formed on the upper surface 331 (front surface) and the side surface 332 of the sealing portion 330 using a conductive material in vacuum atmosphere having a pressure lower than atmospheric pressure, by the vacuum film-forming method, such as vapor deposition, sputtering or CVD. On such an occasion, as illustrated in FIG. 21, a conductive material is caused to pass through the second groove 372 in low vacuum atmosphere, to form the shielding film 360 on a side surface of the substrate 310.

Figure 24:
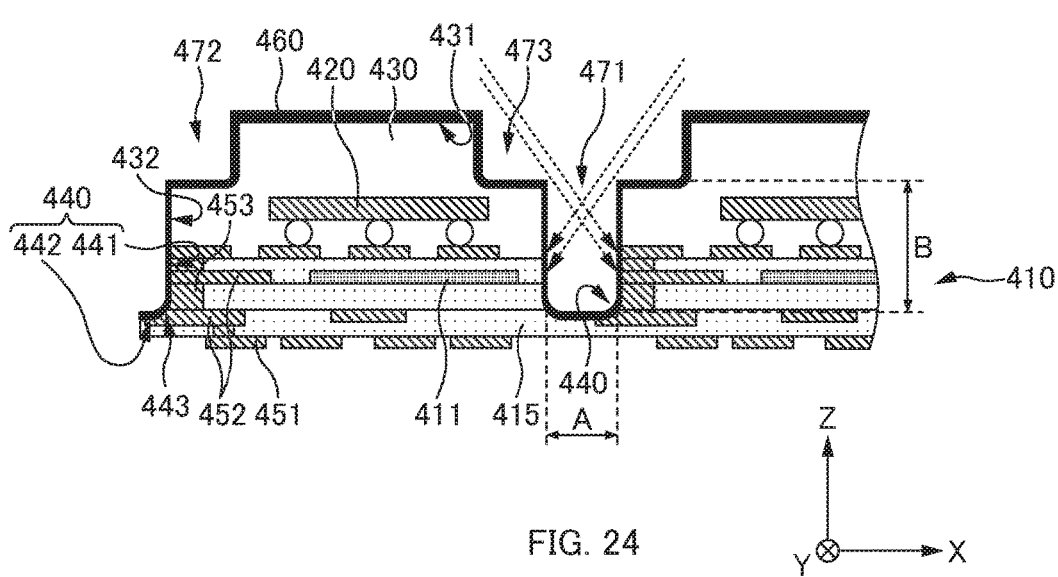
FIG. 24 is a diagram illustrating, in detail, a process of forming a shielding film, in a process of manufacturing an electronic component module of FIG. 22.

Finally, as illustrated in FIG. 19, the electronic component modules 3 are produced such that the dicing region DL5 is further ground to separate the assembly substrate 315, to obtain the singulated substrates 310 (first insulating substrate) which constitute the electronic component modules 3. Note that the passage area 372 is provided, preferably, not on the side surface on the contact portion 340 side but on the side surface on the opposing side. With reference to FIG. 24, as understood from arrows near a removal portion 473, it is possible to reach the contact portion 340 from this passage area in a straight line.

Third Embodiment

Figure 22:
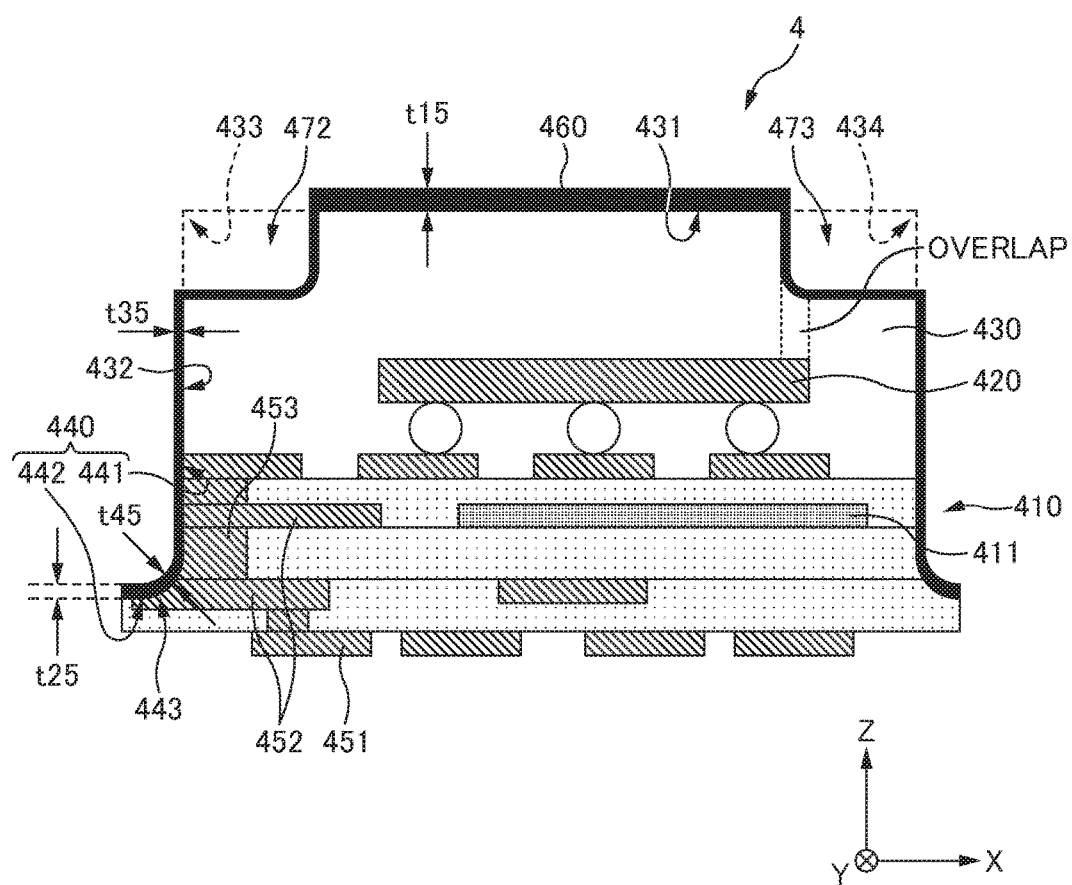
FIG. 22 is a schematic diagram illustrating an electronic component module according to a third embodiment.
Figure 23:
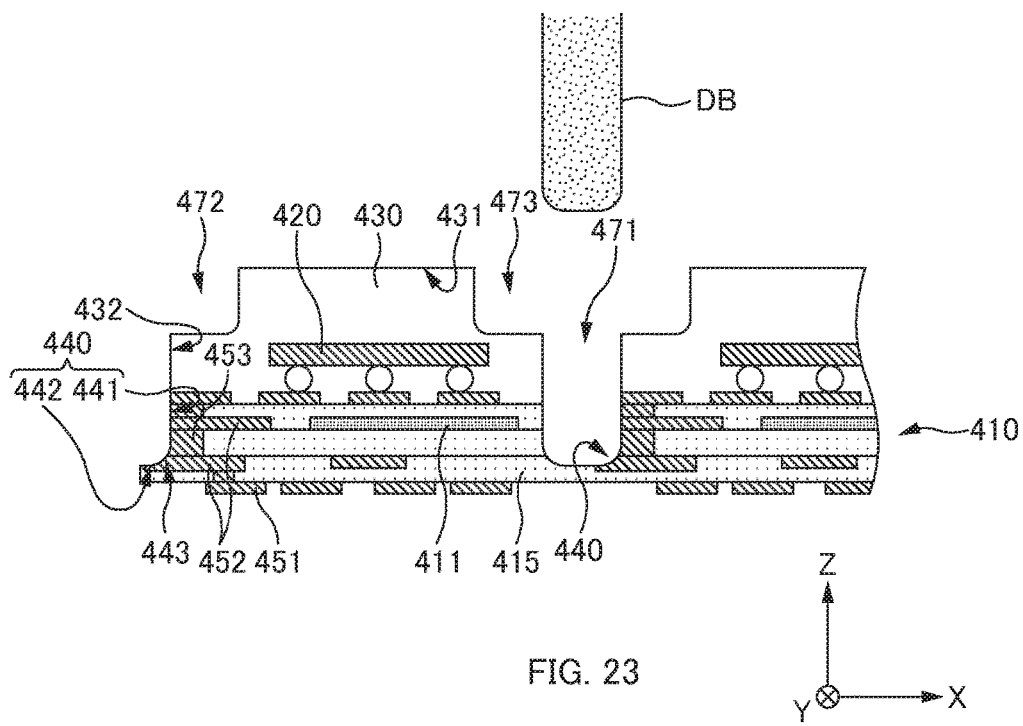
FIG. 23 is a diagram illustrating, in detail, a process of forming a groove and a removal portion, in a process of manufacturing an electronic component module of FIG. 22.

An electronic component module 4 according to the third embodiment will be described with reference to FIGS. 22 to 24. FIG. 22 is a schematic diagram illustrating the electronic component module 4 according to the third embodiment. FIG. 23 illustrates, in detail, a process of forming a groove 471 and a removal portion 472, and FIG. 24 illustrates, in detail, a process of forming a shielding film 460.

The electronic component module 4 according to the third embodiment includes a substrate 410, an electronic component 420, a sealing portion 430, a contact portion 440, the shielding film 460, and the removal portion 472, similarly to the second embodiment, and further includes the removal portion 473. The removal portion 473 is formed also in an edge portion 434 on the opposing side of the removal portion 472, as illustrated in FIG. 22. The removal portion 473 may be formed by a method similar to the method for the removal portion 472 when the removal portion 472 is formed.

The removal portion 473 is formed, for example, on a side surface opposed to a vertical surface on which the contact portion 440 is formed. Accordingly, as illustrated in FIG. 24, more sputtering metal particles having characteristics of traveling straight can enter the bottom portion of the groove 471, thereby being able to form a thicker film onto the contact portion 440, as compared with the case where only the removal portion 472 is provided.

As illustrated in FIG. 24, the removal portion 473 is preferably formed such that a length (distance) B of the side surface from the bottom surface of the groove 471 to the bottom surface of the removal portion 473 is twice or smaller with respect to a width A of the groove 471. With the removal portion 473 being formed as such, scattered particles of a conductive material can pass through a space (region) formed by the removal portion 473 in a process of forming the shielding film 460.

It is preferable that at least one of the removal portions 472, 473 is formed vertically above the electronic component 420 (see FIG. 22). That is, it is preferable that at least one of the removal portions 472, 473 is disposed to overlap with all or a part of the electronic component 420, when viewed from the upper surface side. With such an arrangement being employed, it is possible to reduce the size and cost of the electronic component module 4.

Further, in order to reduce the size and cost of the electronic component module 4, it is considered that the electronic component 420 having a low height (a length in the Z-axis direction) is disposed near the outer periphery (side surface 432) of the electronic component module 4.

Modified Example 1 of Third Embodiment

Figure 25:
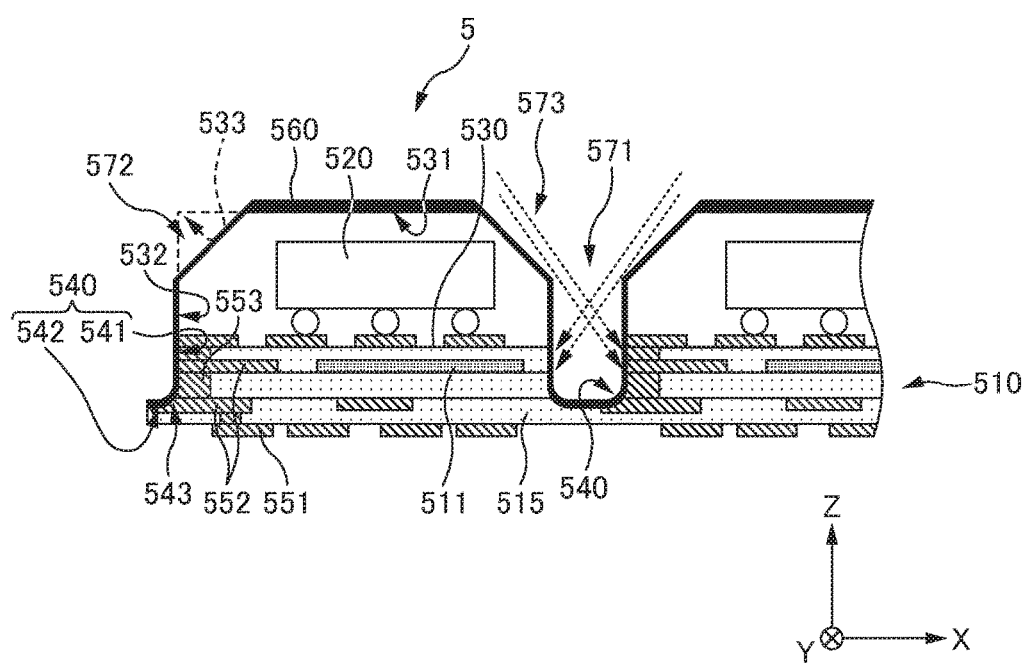
FIG. 25 is a schematic diagram illustrating an electronic component module according to a modified example 1 of a third embodiment.

With reference to FIG. 25, an electronic component module 5 according to a modified example 1 of the third embodiment will be described. FIG. 25 is a schematic diagram illustrating the electronic component module 5 according to the modified example 1.

The electronic component module 5 according to the modified example 1 of the third embodiment includes a substrate 510, an electronic component 520, a sealing portion 530, a contact portion 540, a shielding film 560, a removal portion 572, and a removal portion 573, similarly to the third embodiment. The removal portion 572 and the removal portion 573 are formed by cutting off an edge 533 and an edge 534 (not shown) of the sealing portion 530, similarly to the third embodiment. However, the removal portions 572 and 573 according to the modified example 1 of the third embodiment are different from the removal portions 472 and 473 according to the third embodiment in that the removal portion 572 is a slope inclined outward (on the negative side in the X-axis in FIG. 25) and the removal portion 573 is a slope inclined outward (on the positive side in the X-axis in FIG. 25).

In such a removal portion 572, it is preferable that a height of the side surface 532 to be cut off (a length in the Z-axis direction) is twice or smaller with respect to a width of an upper surface 531 to be cut off (a length in the X-axis direction). In this case, in a process of forming the shielding film 560, scattering particles of a conductive material having characteristics of traveling straight can pass through a space formed by the removal portion 572. Thus, it is possible to form the shielding film 560 having a sufficient film thickness on a side surface of a package, even in the case where intervals between packages on the assembly substrate are small. This enhances productivity of the electronic component module 5.

Summary

According to such an embodiment, it is possible to form the shielding film 60 (160, 260, 360, 460, 560) in a state of an assembly substrate, and rearrangement and tape fixing of semiconductor packages at the time of film formation after singulation is unnecessary. Further, since productivity is enhanced, manufacturing cost can be reduced. Furthermore, it is possible to improve quality and yields, since there is no wraparound of a film forming material to the back side of the substrate 10 (110, 210, 310, 410, 510), as in the case where film formation is performed after singulation.

Further, it is preferable that the contact portion 40 (140, 240, 340, 440, 540) is configured to be electrically connected with the conductive pattern 11 (111, 211, 311, 411, 511), and the contact portion 40 (140, 240, 340, 440, 540) includes at least one of the electrode 52 (152, 252, 352, 452, 552) provided to a front layer or an inner layer of the substrate 10 (110, 210, 310, 410, 510); the via 53 (153, 253, 353, 453, 553) provided so as to connect between the electrode 52 (152, 252, 352, 452, 552) and a r layer above the the electrode 52 (152, 252, 352, 452, 552) or a layer below the electrode 52 (152, 252, 352, 452, 552), or therebetween; or a through hole provided to an upper layer or an lower layer with respect to the electrode 52 (152, 252, 352, 452, 552).

According to such an embodiment, the contact area between the contact portion 40 (140, 240, 340, 440, 540) and the shielding film 60 (160, 260, 360, 460, 560) is increased, and thus contact resistance can be reduced.

Further, the electrode 52 (152, 252, 352, 452, 552) of the contact portion 40 (140, 240, 340, 440, 540) includes the solid ground 54.

In such an embodiment, the contact area between the contact portion 40 (140, 240, 340, 440, 540) and the shielding film 60 (160, 260, 360, 460, 560) is increased, and thus contact resistance can be reduced.

Further, it is preferable that the plurality of vias 53 (153, 253, 353, 453, 553) or through holes is formed in a row or provided to be arranged at random, in a portion corresponding to the side surface (132, 232, 332, 432, 532) of the sealing portion 30 (130, 230, 330, 430, 530).

According to such an embodiment, since the contact portion 40 (140, 240, 340, 440, 540) is largely exposed when dicing is performed, the contact area between the contact portion 40 (140, 240, 340, 440, 540) and the shielding film 60 (160, 260, 360, 460, 560) is increased. This leads to reduction in contact resistance.

Further, it is preferable that the contact portion 40 (140, 240, 340, 440, 540) includes the curved surface 43 (143, 243, 343, 443, 543) between the vertical surface 41 (141, 241, 341, 441, 541) and the horizontal surface 42 (142, 242, 342, 442, 542).

According to such an embodiment, it is possible to secure a sufficient thickness of the shielding film 60 (160, 260, 360, 460, 560). Thus, it is possible to reduce resistance of the shielding film 60 (160, 260, 360, 460, 560), as well as suppress the shielding film 60 (160, 260, 360, 460, 560) from peeling off from the electronic component module 1 (2, 3, 4, 5). This leads to enhancement of quality of the electronic component module 1 (2, 3, 4, 5).

Further, it is preferable that t11>t31 (t12>t32, t13>t33, t14>t34, t15>t35), and t21>t31 (t22>t32, t23>t33, t24>t34, t25>t35) or t41>t31 (t42>t32, t43>t33, t44>t34, t45>t35), where t11 (t12, t13, t14, t15) is a film thickness of the shielding film 60 (160, 260, 360, 460, 560) in the upper surface 31 (131, 231, 331, 431, 531) of the sealing portion 30 (130, 230, 330, 430, 530), t21 (t22, t23, t24, t25) is a film thickness of the shielding film 60 (160, 260, 360, 460, 560) in the horizontal surface 42 (142, 242, 342, 442, 542) of the contact portion 40 (140, 240, 340, 440, 540), t31 is a film thickness of the shielding film 60 (160, 260, 360, 460, 560) in the side surface 32 (132, 232, 332, 432, 532) of the sealing portion 30 (130, 230, 330, 430, 530), and t41 is a film thickness of the shielding film 60 (160, 260, 360, 460, 560) in the curved surface 43 (143, 243, 343, 443, 543) of the contact portion 40 (140, 240, 340, 440, 540).

Further, it is preferable that the removal portion 372 (472, 473, 572, 573), which is formed by cutting off the edge portion 333 (433, 533) formed by the upper surface 331 (431, 531) and the side surface 332 (432, 532) of the sealing portion 330 (430, 530), is included and the removal portion 372 (472, 473, 572, 573) is a region where a conductive material scattered in vacuum atmosphere having a pressure lower than atmospheric pressure is allowed to a pass therethrough, so as to coat the contact portion 340 (440, 540) with the shielding film 360 (460, 560).

According to such an embodiment, the shielding film 360 (460, 560) having a sufficient film thickness is easily formed using the vacuum film-forming technique, such as vapor deposition, sputtering, or CVD. This leads to enhancement of productivity and quality of the electronic component module 3 (4, 5).

Further, it is preferable that the removal portion 372 (472, 473, 572, 573) is formed above the electronic component 320, 420, 520. According to such an embodiment, a predetermined film thickness can be ensured in the contact portion 340, 440, 540. Further, employment of such an arrangement enables reduction in size and cost of the electronic component module 3, 4, 5.

Further, it is preferable that the contact portion 40 (140, 240, 340, 440, 540) is provided on one side of the substrate 10 (110, 210, 310, 410, 510) where the contact portion 40 (140, 240, 340, 440, 540) is positioned, and that the sealing portion 30 (130, 230, 330, 430, 530) on one side and the substrate 10 (110, 210, 310, 410, 510) underlying the sealing portion 30 (130, 230, 330, 430, 530) on one side are ground to be exposed by a dicing apparatus. According to such an embodiment, a predetermined film thickness can be ensured in the contact portion 40 (140, 240, 340, 440, 540) of the substrate 10 (110, 210, 310, 410, 510).

Although embodiments of the present disclosure have been described above, the present disclosure is not limited thereto. The foregoing materials, shapes, and arrangements of components are merely embodiments for implementing the present disclosure, and can be variously changed without departing from the gist the disclosure.

For example, matters described in the first to third embodiments and modified examples can be freely combined. To give an example, the removal portion 372 described in the second embodiment or the removal portion 472, 572 described in the third embodiment and the modified example 1 of the third embodiment may be applied to the electronic component module 1 according to the first embodiment and the electronic component module 2 according to the modified example 1.

What is claimed is:
1. A method of manufacturing a plurality of identical electronic component modules, including preparing an assembly substrate in which, in a plan view, a plurality of unit regions are defined in a matrix, boundaries between the unit regions defining dicing lines in a lattice pattern in the plan view along which the assembly substrate will be diced into the plurality of identical electronic component modules, the assembly substrate including:

a base substrate;

an electronic component mounted in each of the plurality of unit regions on the base substrate;

an electrode pattern in each of the plurality of unit regions within the base substrate; and a sealing member made of an insulating material covering an entire surface of the base substrate including the electronic components respectively mounted in the plurality of unit regions;

digging a first groove along the dicing lines from a top surface of the sealing member, the first groove penetrating the sealing member and reaching an intermediate depth within the base substrate, a lower portion of the first groove defining and exposing a side face of the base substrate and a side face of the electrode pattern in each of the plurality of unit regions;

widening an upper portion of the first grove to define a second groove that is continuous with the lower portion of the first groove, the second groove thereby starting from the top surface of the sealing member and having a width larger than and a depth shallower than the first groove, the lower portion of the first grove and the second grove defining step-shaped sidewalls of the sealing members in each of the plurality of unit regions;

forming a shielding film by depositing, in a low-pressure atmosphere having a pressure lower than an atmospheric pressure, a film made of a conductive material on the top surface of the sealing member and on inner walls of the first and second grooves that include the sidewalls of the sealing member, the second groove providing a pathway for the conductive material to reach the inner walls of the first groove, the shielding film thereby covering the top surface of the sealing member and the inner walls of the first and second grooves and being in contact with the exposed side face of the electrode pattern in each of the plurality of unit regions; and thereafter, separating the assembly substrate into the plurality of identical electronic component modules by cutting the base substrate at a bottom of the lower portion of the first groove along the dicing lines.

2. The method according to claim 1, wherein the depositing of the film made of the conductive material is performed by vapor deposition, sputtering or CVD.

3. The method according to claim 1,
wherein the assembly substrate includes one or more vias in contact with the electrode pattern adjacent to the dicing lines in each of the plurality of unit regions,
wherein the lower portion of the first groove defines and exposes a side face of said one or more vias in each of the plurality of unit regions, and
wherein the shielding film is formed so as to be in contact with the side face of said one or more vias in each of the plurality of unit regions.

4. The method according to claim 1,
wherein the first groove defines and exposes a substantially horizontal portion of an electrode that is included in the base substrate at the bottom of the lower portion of the first groove in each of the plurality of unit regions, and
wherein the shielding film is formed so as to be in contact with the substantially horizontal portion of the electrode at the bottom of the lower portion of the first groove.

* * * * *